(12) United States Patent
Sakamoto

(10) Patent No.: US 8,969,941 B2
(45) Date of Patent: Mar. 3, 2015

(54) SEMICONDUCTOR DEVICE AND METHOD FOR MANUFACTURING SAME

(71) Applicant: Kabushiki Kaisha Toshiba, Tokyo (JP)

(72) Inventor: Wataru Sakamoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/772,702

(22) Filed: Feb. 21, 2013

(65) Prior Publication Data

US 2014/0001532 A1 Jan. 2, 2014

(30) Foreign Application Priority Data

Jun. 27, 2012 (JP) ................................ 2012-144288

(51) Int. Cl.
*H01L 29/788* (2006.01)
*H01L 29/66* (2006.01)
*H01L 21/28* (2006.01)
*H01L 27/115* (2006.01)

(52) U.S. Cl.
CPC ........ *H01L 29/788* (2013.01); *H01L 29/66825* (2013.01); *H01L 29/7881* (2013.01); *H01L 21/28273* (2013.01); *H01L 27/11519* (2013.01); *H01L 27/11529* (2013.01)
USPC ........... 257/315; 257/314; 257/316; 257/288; 257/326; 257/E27.002; 257/E27.009; 257/E27.077; 257/E27.075; 257/324; 438/261; 438/424

(58) Field of Classification Search
USPC .................. 257/288, 326, E27.002, E27.009, 257/E27.077, E27.075, 324, 66, 67, 401, 257/314–316; 438/261, 424
See application file for complete search history.

(56) References Cited

U.S. PATENT DOCUMENTS

| | | | |
|---|---|---|---|
| 6,818,508 B2 | 11/2004 | Shimizu et al. | |
| 6,835,978 B2 | 12/2004 | Matsui et al. | |
| 7,906,806 B2 | 3/2011 | Rosmeulen | |
| 2001/0000626 A1* | 5/2001 | Kalnitsky et al. | 257/316 |
| 2008/0268596 A1* | 10/2008 | Pham et al. | 438/261 |
| 2008/0315280 A1 | 12/2008 | Watanabe et al. | |
| 2009/0003070 A1 | 1/2009 | Gomikawa et al. | |
| 2009/0206390 A1 | 8/2009 | Morikado | |
| 2009/0230460 A1 | 9/2009 | Yaegashi | |
| 2010/0155813 A1* | 6/2010 | Murata et al. | 257/316 |
| 2011/0121286 A1* | 5/2011 | Yamazaki et al. | 257/43 |
| 2011/0134680 A1* | 6/2011 | Saito | 365/104 |

FOREIGN PATENT DOCUMENTS

| | | |
|---|---|---|
| JP | 2001-284556 | 10/2001 |
| JP | 2011-142246 | 7/2011 |

* cited by examiner

*Primary Examiner* — Matthew Reames
*Assistant Examiner* — Vincent Wall
(74) *Attorney, Agent, or Firm* — Oblon, McClelland, Maier & Neustadt, L.L.P.

(57) ABSTRACT

According to an embodiment, a semiconductor device, includes a semiconductor substrate, first and second transistors. The first transistor includes a first insulating film provided on the semiconductor substrate, a first conductive film provided on the first insulating film, a second insulating film provided on the first conductive film, and a second conductive film provided on the second insulating film. The second transistor is provided to be separated from the first transistor, the second transistor including a third insulating film provided on the semiconductor substrate, a third conductive film provided on the third insulating film, a fourth insulating film provided on the third conductive film, and a fourth conductive film provided on the fourth insulating film. The third conductive film is thicker than the first conductive film, and the second transistor has a through-portion piercing the fourth insulating film to connect the third conductive film and the fourth conductive film.

15 Claims, 23 Drawing Sheets

US 8,969,941 B2

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2012-144288, filed on Jun. 27, 2012; the entire contents of which are incorporated herein by reference.

BACKGROUND

The NAND flash memory has been designed to increase the coupling ratio of memory cells by way of increasing the film thickness of the floating gate, which is the charge storage layer, and increasing the contact surface area between the floating gate and the inter-poly dielectric film (the IPD film). However, as downscaling progresses and the distance between adjacent memory cells decreases, the fluctuation of the threshold voltage becomes exceedingly large due to "proximity effects", i.e. the capacitive coupling between the floating gates of adjacent memory cells; and downscaling has become difficult.

DETAILED DESCRIPTION

According to an embodiment, a semiconductor device, includes a semiconductor substrate, a first transistor and a second transistor. The first transistor includes a first insulating film provided on the semiconductor substrate, a first conductive film provided on the first insulating film, a second insulating film provided on the first conductive film, and a second conductive film provided on the second insulating film. The second transistor is provided to be separated from the first transistor in a plane of the semiconductor substrate, the second transistor including a third insulating film provided on the semiconductor substrate, a third conductive film provided on the third insulating film, a fourth insulating film provided on the third conductive film, and a fourth conductive film provided on the fourth insulating film. The third conductive film is thicker than the first conductive film, and the second transistor has a through-portion piercing the fourth insulating film to connect the third conductive film and the fourth conductive film.

Embodiments of the invention will now be described with reference to the drawings.

First, a first embodiment will be described.

Figure 1A:
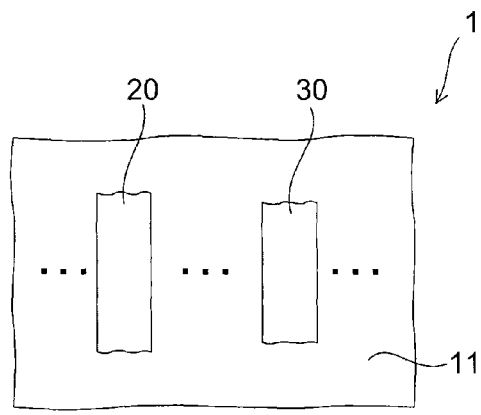
FIGS. 1A to 1C are schematic plan views illustrating one example of a semiconductor device according to a first embodiment.
Figures 1B, 1C:
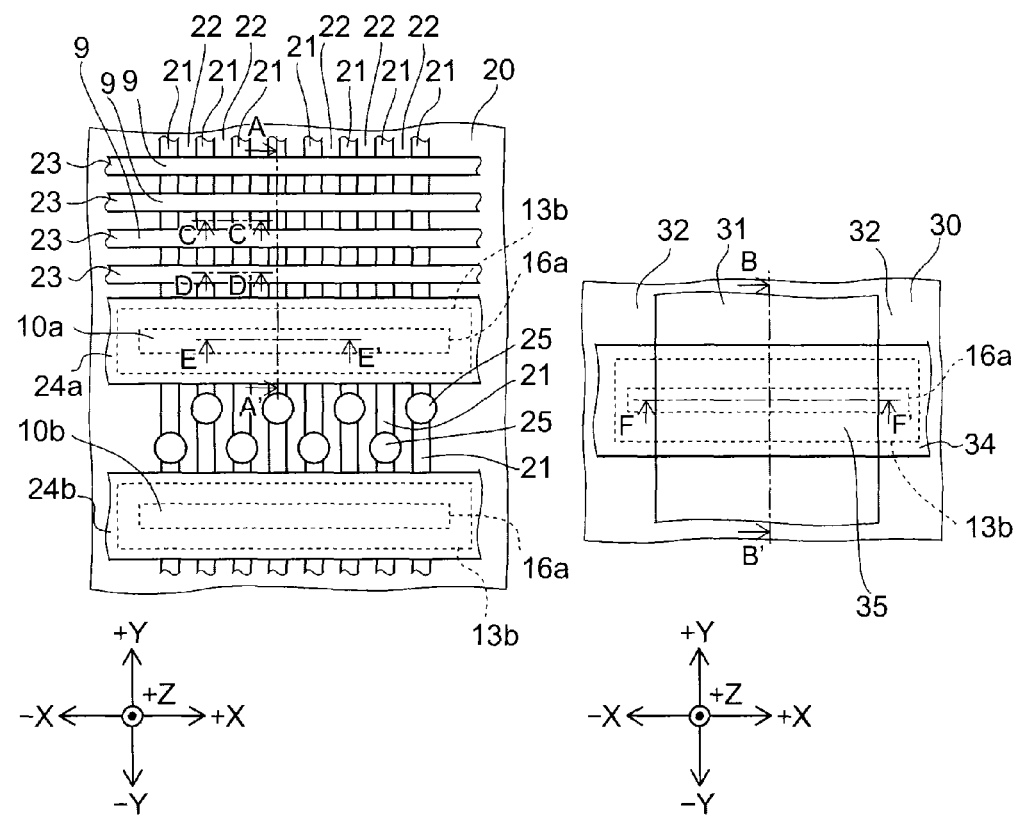

FIGS. 1A to 1C are plan views showing one example of a semiconductor device according to the first embodiment.

As shown in FIG. 1A, the semiconductor device 1 includes a semiconductor substrate 11. The semiconductor substrate 11 is, for example, a silicon substrate. When viewed from above, a cell region 20 and a peripheral region 30 are set in the semiconductor substrate 11. The semiconductor substrate 11 may include an epitaxial layer at the upper surface of the semiconductor substrate 11.

FIG. 1B is a plan view showing the cell region of the semiconductor device 1.

As shown in FIG. 1B, the cell region 20 includes multiple element regions 21 extending in one direction.

In the specification, an XYZ orthogonal coordinate system is employed to describe the cell region 20 and the peripheral region 30. In the XYZ orthogonal coordinate system, one direction in a plane parallel to the upper surface of the semiconductor substrate 11 is taken as a +Y direction; and the reverse direction of the +Y direction is taken as a −Y direction. A direction orthogonal to the +Y direction in the plane parallel to the upper surface of the semiconductor substrate 11 is taken as a +X direction; and the reverse direction of the +X direction is taken as a −X direction. One direction orthogonal to both the +X direction and the +Y direction is taken as a +Z direction; and the reverse direction of the +Z direction is taken as a −Z direction. The +X direction and the −X direction also are generally referred to as the X direction. The +Y direction and the −Y direction also are generally referred to as the Y direction. The +Z direction and the −Z direction also are generally referred to as the Z direction.

The element regions 21 are disposed to extend in the Y direction. The element regions 21 are disposed periodically in the X direction. STI (Shallow Trench Isolation) regions 22 are provided between the element regions 21. Multiple word lines 23 are provided on the element regions 21 and the STI regions 22 to extend in the X direction. The word lines 23 are disposed periodically in the Y direction. A memory cell transistor 9 (a first transistor) is provided at each of the portions where the element regions 21 and the word lines 23 cross. Namely, the gate electrode of the memory cell transistor is provided between the element region 21 and the word line 23. A portion of the element region 21 functions as the channel of the memory cell transistor; and a portion of the word line 23 functions as the control gate of the memory cell transistor 9.

Multiple selection gates 24a and 24b are provided on the element regions 21 and the STI regions 22 to extend in the X direction. The selection gates 24a and 24b are disposed to be adjacent in the Y direction. Selection transistors 10a and selection transistors 10b (second transistors) are provided at the portions where the element regions 21 cross the selection gates 24a and 24b, respectively. A conductive film 13b (referring to FIGS. 2A and 2B) is provided between the selection gate 24a and the element region 21 and between the selection gate 24b and the element region 21 with a gate insulating film interposed. A through-portion 16a is provided to electrically connect the conductive film 13b to the selection gate 24a and the selection gate 24b. The through-portion 16a is provided in the selection gate 24a and in the selection gate 24b and extends in the X direction. In other words, the conductive film 13b and portions of the selection gates 24a and 24b are included in the gate electrodes of the selection transistors 10a and 10b.

A contact 25 is provided on each of the element regions 21 between the selection gate 24a and the selection gate 24b. The contacts 25 are disposed, for example, in a staggered configuration in the X direction. In other words, the contacts 25 disposed on the selection gate 24a side of the center of the element region 21 between the selection gate 24a and the selection gate 24b are disposed alternately with the contacts 25 disposed on the selection gate 24b side of the center.

FIG. 1C is a plan view showing the peripheral region of the semiconductor device 1.

As shown in FIG. 1C, an element region 31 extending in the Y direction is provided in the peripheral region 30. Multiple STI regions 32 extending in the Y direction are provided in the peripheral region 30; and the element region 31 is provided between the multiple STI regions 32.

A selection gate 34 extending in the X direction is provided on the element region 31 and on the STI regions 32. A peripheral transistor 35 (a second transistor) is provided at the portion where the selection gate 34, which serves as a gate electrode 34, crosses the element region 31. The conductive film 13b is provided between the selection gate 34 and the element region 31. The gate electrode 34 is electrically connected to the conductive film 13b via the through-portion 16a. The gate electrode 34 and the conductive film 13b are included in the gate electrode of the peripheral transistor 34.

Figure 2A:
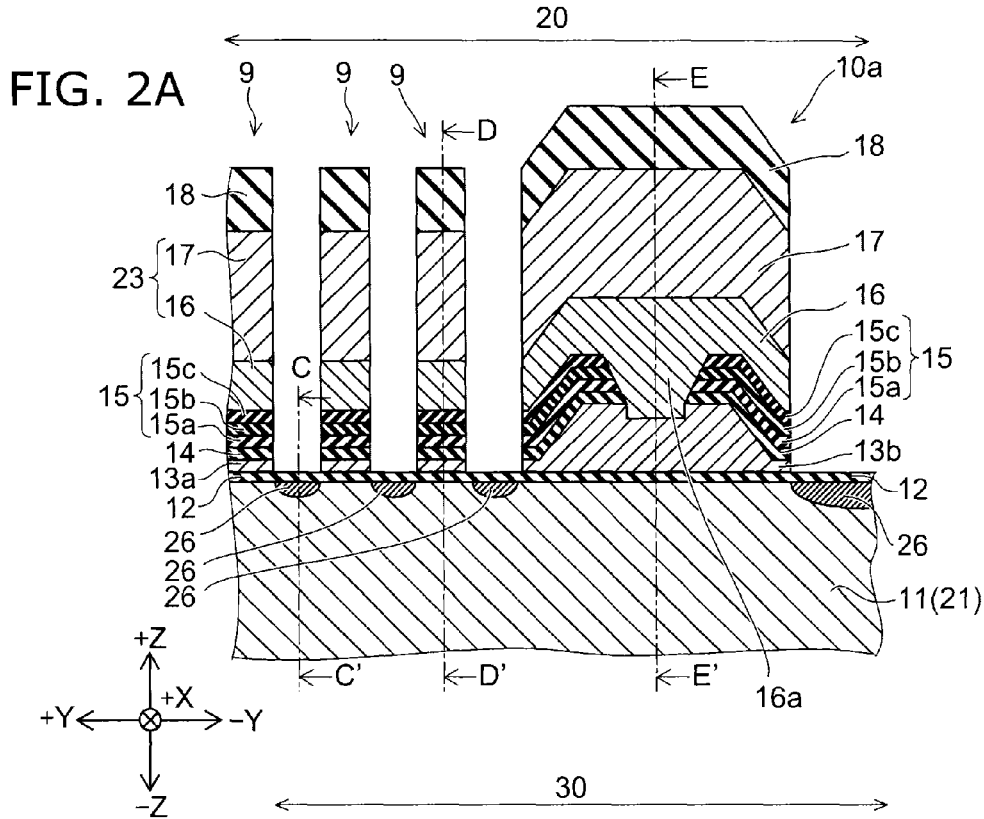
FIGS. 2A and 2B are schematic cross-sectional views illustrating one example of the semiconductor device according to the first embodiment.
Figure 2B:
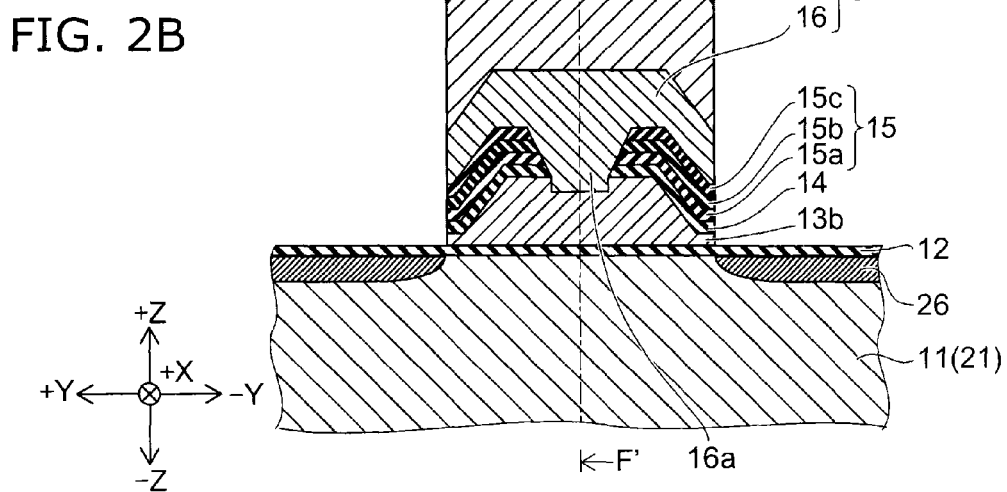

FIGS. 2A and 2B are schematic cross-sectional views showing one example of the semiconductor device according to the first embodiment.

FIG. 2A shows the cell region 20 and is a cross-sectional view along line AA' of FIG. 1B.

As shown in FIG. 2A, the multiple memory cell transistors 9 and the selection transistor 10a are disposed to be separated in the Y direction on the semiconductor substrate 11 in the cell region 20. In the memory cell transistor 9, a tunneling insulating film 12 (a first insulating film) is provided on the semiconductor substrate 11. The tunneling insulating film 12 is, for example, a silicon oxide film. The thickness of the tunneling insulating film 12 is, for example, not more than 8 nm, e.g., 5 nm.

A conductive film 13a (a first conductive film) is provided on the tunneling insulating film 12. The conductive film 13a includes, for example, polysilicon. The thickness of the conductive film 13a is, for example, not more than 15 nm and favorably 5 nm to 10 nm. The thickness of the conductive film 13a is not more than 3 times that of the tunneling insulating film 12. The conductive film 13a functions as, for example, a floating gate. An insulating film 14 (a second insulating film) is provided on the conductive film 13a. The insulating film 14 includes, for example, hafnium oxide ($HfO_2$). An inter-poly dielectric film 15 is provided on the insulating film 14. The inter-poly dielectric film 15 is, for example, a stacked film and includes, from the lowest layer, a silicon oxide film 15a, a hafnium oxide ($HfO_2$) film 15b, and a tantalum oxide (TaO) film 15c. The inter-poly dielectric film 15 also is referred to as the blocking film.

A conductive film 16 (a second conductive film) is provided on the inter-poly dielectric film 15. The conductive film 16 includes, for example, polysilicon. A metal film 17 is provided on the conductive film 16. The metal film 17 includes, for example, tungsten (W). The conductive film 16 and the metal film 17 are included in the word line 23. The word line 23 functions as a control gate. A mask member 18 is provided on the word line 23. An impurity region 26 is provided in the element region 21 between the regions directly under the word lines 23. The impurity region 26 functions as a source/drain region.

In the selection transistor 10a, the tunneling insulating film 12 (the third insulating film) is provided on the semiconductor substrate 11. The conductive film 13b (the third conductive film) is provided on the tunneling insulating film 12. The side surface of the conductive film 13b facing the Y direction is tapered. In other words, the width of the conductive film 13 in the Y direction is large at the lower portion and decreases upward. The maximum thickness of the conductive film 13b is, for example, 30 nm and is thicker than the thickness of the conductive film 13a. The upper surface of the conductive film 13b is positioned higher than the upper surface of the conductive film 13a. The insulating film 14 (the fourth insulating film) is provided on the upper surface of the conductive film 13 and on the side surface of the conductive film 13. The inter-poly dielectric film 15 is disposed on the insulating film 14. The conductive film 16 (the fourth conductive film) is disposed on the inter-poly dielectric film 15.

The conductive film 16 has the through-portion 16a that pierces the inter-poly dielectric film 15 and the insulating film 14 to reach the conductive film 13b. The width of the through-portion 16a in the Y direction is narrower than the width of the upper surface of the conductive film 13 in the Y direction. The metal film 17 is provided on the conductive film 16. The mask member 18 is provided on the metal film 17. The impurity region 26 is formed in the element region 21 between the region directly under the selection gate 24a and the region directly under the word line 23 of the memory cell transistor 9 adjacent to the selection transistor 10a and between the regions directly under the selection gate 24a and the selection gate 24b. The impurity region 26 functions as a source/drain region.

Although the tunneling insulating film 12 of FIG. 2A is provided in a state of communicating between the selection transistor 10a and the multiple memory cell transistors 9, the tunneling insulating film 12 may be provided for each transistor under the conductive films 13a and 13b to be mutually separated. A depth of the depression of the conductive film 13b provided at the through-portion 16a is larger than the thickness of the conductive film 13a, wherein the depth of the depression is the distance between the highest upper face of the conductive film 13b, which contacts the bottom face of the conductive film 16, and the bottom face of the insulating film 14 provided on the thickest portion of the conductive film 13b.

FIG. 2B shows the peripheral region 30 and is a cross-sectional view along line BB' of FIG. 1C. As shown in FIG. 2B, the peripheral transistor 35 is provided on the semiconductor substrate 11 in the peripheral region 30.

The peripheral transistor 35 includes the tunneling insulating film 12 (the third insulating film) provided on the semiconductor substrate 11, and the conductive film 13b (the third conductive film) provided on the tunneling insulating film 12. The side surface of the conductive film 13b facing the Y direction is tapered. The insulating film 14 (the fourth insulating film) is provided on the conductive film 13b; and the inter-poly dielectric film 15 is provided on the insulating film 14. The conductive film 16 (the fourth conductive film) is provided on the inter-poly dielectric film 15. The conductive film 16 has the through-portion 16a that pierces the inter-poly dielectric film 15 and the insulating film 14 to reach the conductive film 13b. The metal film 17 is provided on the conductive film 16; and the mask member 18 is provided on the metal film 17. The gate electrode 34 includes the conductive film 16 having the through-portion 16a and the metal film 17.

Figure 3A:
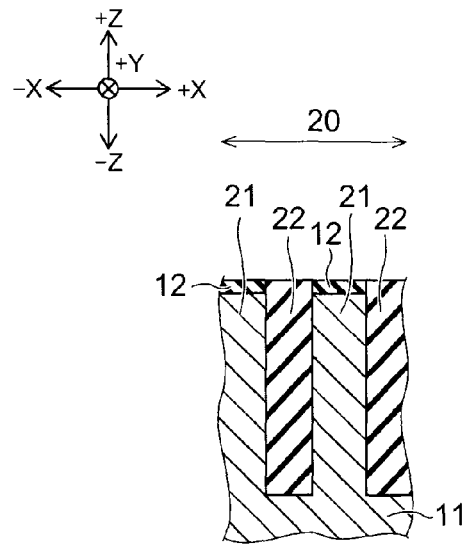
FIGS. 3A to 3D are schematic views illustrating one example of other cross sections of the semiconductor device according to the first embodiment.

FIGS. 3A to 3D are schematic views showing one example of other cross sections of the semiconductor device according to the first embodiment. FIG. 3A shows the structure between the memory cell transistors 9 and is a cross-sectional view along line CC' of FIG. 1B and line CC' of FIG. 2A.

In the cell region 20 as shown in FIG. 3A, the STI regions 22 are filled into the upper portion of the semiconductor substrate 11 to extend in the Y direction. The multiple STI regions 22 are disposed periodically in the X direction. The tunneling insulating film 12 is provided on the STI regions 22.

The portions of the semiconductor substrate 11 between the STI regions 22 are the element regions 21.

Figure 3B:
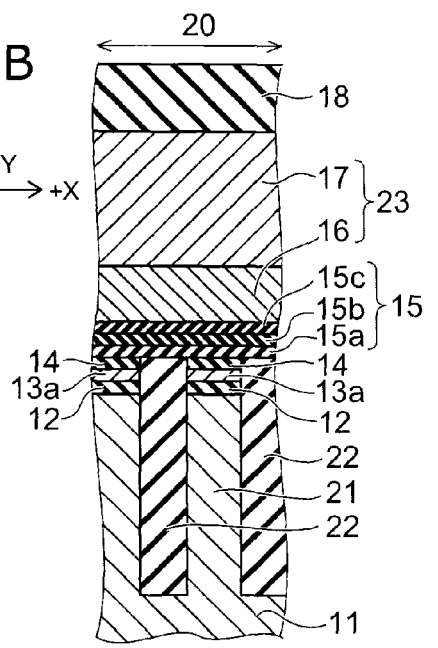

FIG. 3B shows the cross-sectional structure of the memory cell transistor 9 and is a cross-sectional view along line DD' of FIG. 1B and line DD' of FIG. 2A.

As shown in FIG. 3B, the tunneling insulating film 12 is provided on the semiconductor substrate 11 in the region directly under the word line 23. The conductive film 13a is provided on the tunneling insulating film 12. The insulating film 14 is provided on the conductive film 13a.

The STI regions 22 are filled into the upper portion of the semiconductor substrate 11 to pierce the conductive film 13 and the tunneling insulating film 12 from the upper surface of the insulating film 14 and extend in the Y direction. The STI regions 22 are provided periodically in the X direction. The portions of the semiconductor substrate 11 between the STI regions 22 are active regions (part of the element regions 21). The inter-poly dielectric film 15 is provided on the STI regions 22. The conductive film 16 is provided on the inter-poly dielectric film 15; and the metal film 17 is provided on the conductive film 16. The conductive film 16 and the metal film 17 are included in the word line 23. The mask member 18 is provided on the metal film 17. The portions of the semiconductor substrate 11 between the STI regions 22 are the element regions 21.

Figure 3C:
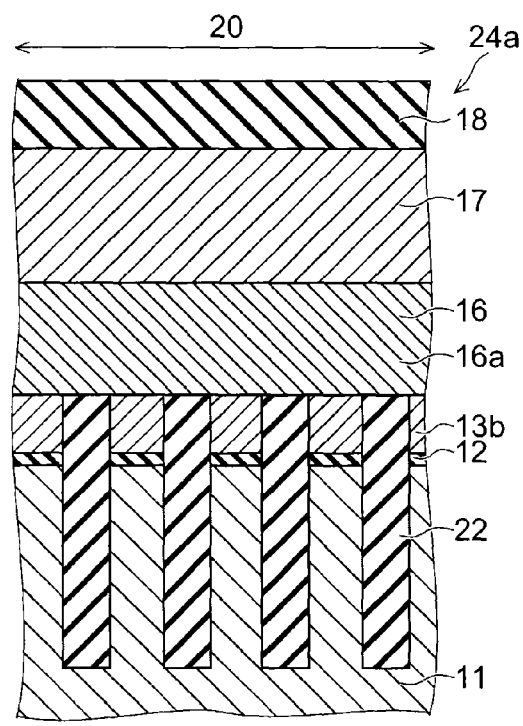

FIG. 3C shows the cross-sectional structure of the selection transistor 10a and is a cross-sectional view along line EE' of FIG. 1B and line EE' of FIG. 2A.

As shown in FIG. 3C, the tunneling insulating film 12 is provided on the semiconductor substrate 11 in the region directly under the selection gate 24a. The conductive film 13b is provided on the tunneling insulating film 12. The STI regions 22 are filled into the upper portion of the semiconductor substrate 11 to pierce the conductive film 13b and the tunneling insulating film 12 and extend in the Y direction. The STI regions 22 are provided periodically in the X direction. The conductive film 16 is provided on the conductive film 13b and on the STI regions 22. The conductive film 16 shown in FIG. 3C has the through-portion 16a. The metal film 17 is provided on the conductive film 16. The mask member 18 is provided on the metal film 17.

Figure 3D:
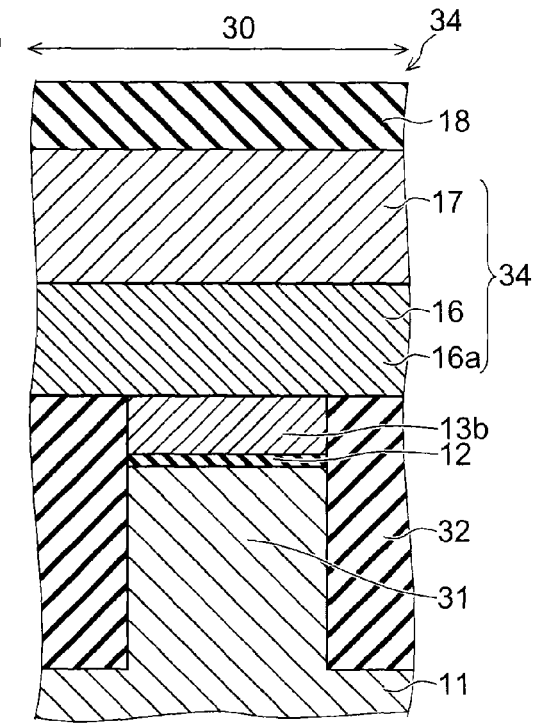

FIG. 3D shows the cross-sectional structure of the selection transistor 35 provided in the peripheral region 30 and is a cross-sectional view along line FF' of FIG. 1C and line FF' of FIG. 2B.

As shown in FIG. 3D, the tunneling insulating film 12 is provided on the semiconductor substrate 11 in the peripheral region 30. The conductive film 13b is provided on the tunneling insulating film 12. The STI regions 32 are filled into the upper portion of the semiconductor substrate 11 to pierce the conductive film 13b and the tunneling insulating film 12 and extend in the Y direction. The STI regions 32 are provided periodically in the X direction. The portion of the semiconductor substrate 11 between the STI regions 32 is the element region 31.

The width of the STI region 32 in the X direction is wider than the width of the STI region 22 of the cell region 20 in the X direction. The width of the element region 31 in the X direction is wider than the width of the element region 21 of the cell region 20 in the X direction. The conductive film 16 that has the through-portion 16a is provided on the conductive film 13b and on the STI regions 32. The metal film 17 is provided on the conductive film 16. The mask member 18 is provided on the metal film 17.

Operations of the semiconductor device according to the embodiment will now be described.

In the cell region 20, the multiple memory cell transistors 9 and the selection transistor 10a arranged along the element region 21 are included in a NAND string by sharing the impurity regions 26 as source/drains. The selection transistor 10a is connected to a bit line via the contact 25 and the impurity region 26 on the side opposite to the memory cell transistors 9. The selection transistor 10a controls the ON and OFF of the current flowing in the element region 21. Thereby, the NAND string which includes the selected memory cell transistors 9 is selected.

The state in which the threshold voltage of the memory cell transistor 9 is low is allotted to, for example, "1;" and the state in which the threshold voltage is high is allotted to, for example, "0."

Programming to the memory cell transistor 9 is performed by applying a high voltage between the word line 23 and the bit line. For example, by switching the selection transistor 10a to the ON state, the selected memory cell transistors 9 that is included the NAND string is electrically connected to the bit line that is connected to the element region 21. Simultaneously, by designating one of the word lines 23, one of the memory cell transistors 9 provided between the bit line and the one of the word lines 23 is selected. A high voltage is applied via the word line 23 and the bit line to the memory cell transistor 9 that is selected. As a result, electrons are injected from the active region, which is part of element region 21, into the conductive film 13a via the tunneling insulating film 12; and the threshold of the memory cell transistor 9 that is selected is increased.

Conversely, when erasing, the word line 23 is set to be 0 V and a high voltage having a polarity reverse to that of the programming is applied to reduce the threshold of the memory cell transistor 9. Reading is performed by applying a voltage to the word line 23 that is intermediate between the voltage of the programming and 0 V. For example, in the state in which the prescribed voltage is applied to the word lines 23 and all of the multiple memory cell transistors 9 are switched to be in the ON state, the voltages of the word lines 23 are set, in order, to be 0 V. In the case where the word line 23 that controls the memory cell transistor 9 for which the threshold voltage is in the "1" state is set to be 0 V, the NAND string is switched to the OFF state; and the drain current does not flow. On the other hand, in the case where the word line 23 that controls the memory cell transistor 9 for which the threshold voltage is in the "0" state is set to be 0 V, the ON state of the NAND string is maintained; and the drain current flows.

In the embodiment, the capacitive coupling between adjacent memory cell transistors 9 is suppressed by reducing the thickness of the conductive film 13a of the memory cell transistor 9. Thereby, the threshold fluctuation between the memory cell transistors 9 can be suppressed; and misoperations can be prevented.

A method for manufacturing the semiconductor device according to the first embodiment will now be described.

FIG. 4A to FIG. 7A are cross-sectional views of processes, showing one example of the manufacturing method in the cell region of the semiconductor device according to the first embodiment; and FIG. 4B to FIG. 7B are cross-sectional views of the processes, showing one example of the manufacturing method in the peripheral region of the semiconductor device according to the first embodiment.

Figure 4A:
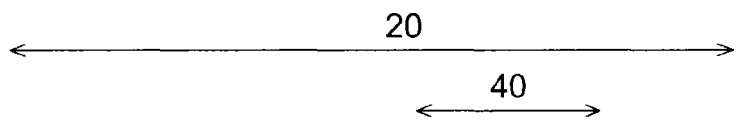
FIGS. 4A to 16B are schematic cross-sectional views illustrating one example of a manufacturing method of the semiconductor device according to the first embodiment.
Figure 4A:
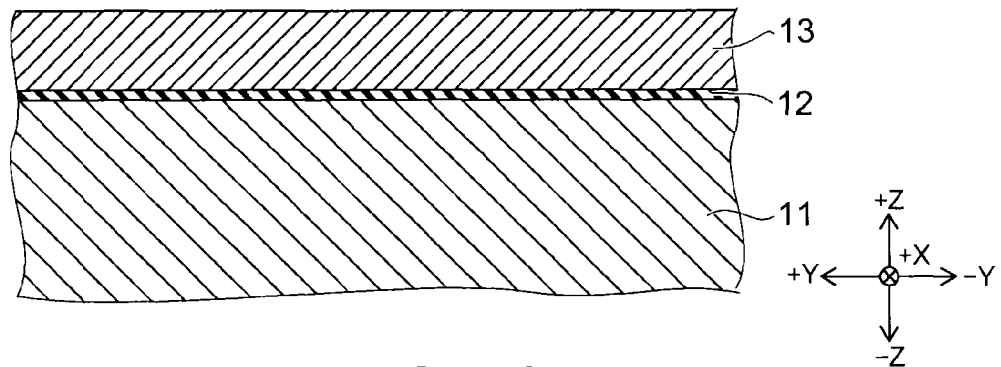
Figure 4B:
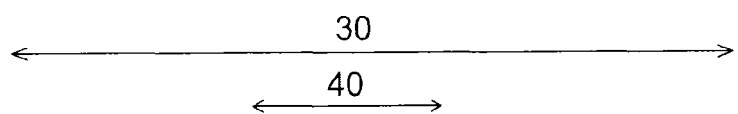
Figure 4B:
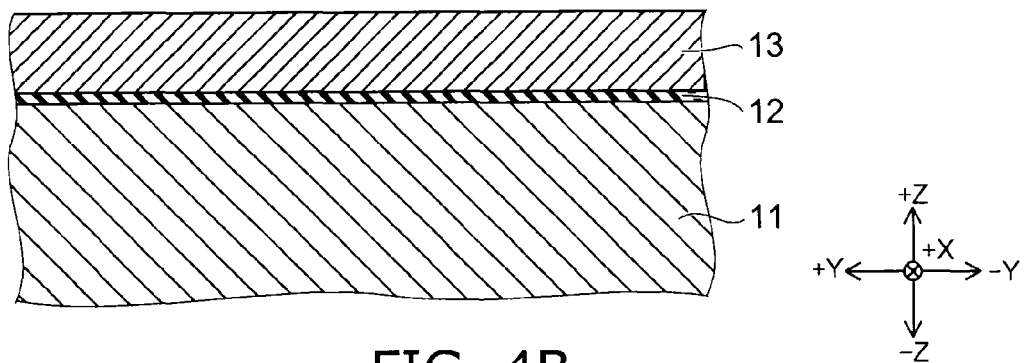

As shown in FIGS. 4A and 4B, the semiconductor substrate 11, e.g., a silicon substrate, is prepared. The cell region 20 (the first region) and the peripheral region 30 (the second region) are set in the semiconductor substrate 11. A region 40 where the selection gate is formed also is set in the cell region 20 and the peripheral region 30. Then, the tunneling insulating film 12, e.g., a silicon oxide film, is formed on the semiconductor substrate 11. Subsequently, the conductive film 13 is formed by depositing a conductive material, e.g., polysilicon, on the tunneling insulating film 12. The thickness of the conductive film 13 is the same as the thickness of the conductive film 13 in the peripheral region 30 and is, for example, 30 nm.

Figure 5A:
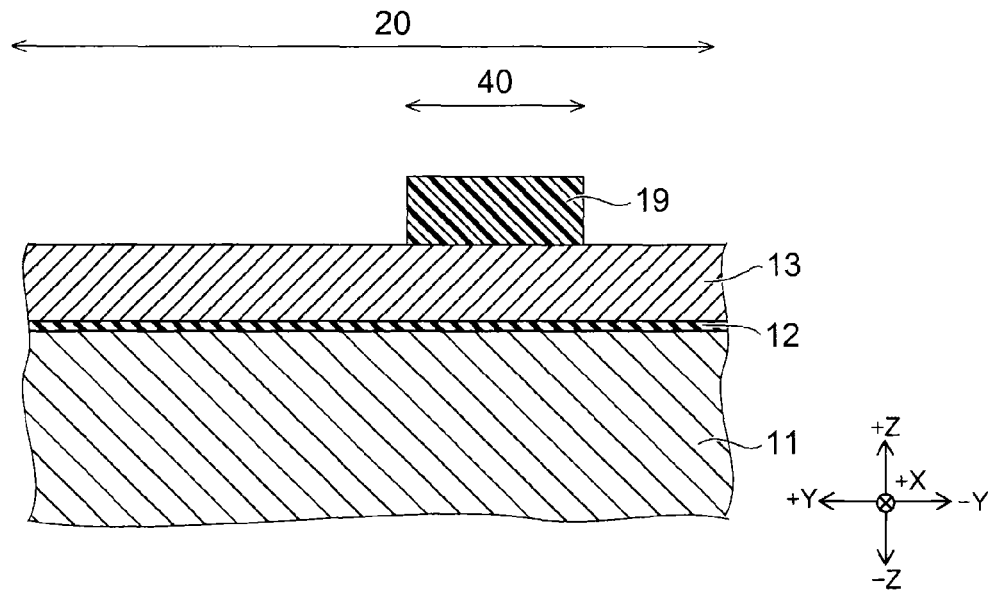
Figure 5B:
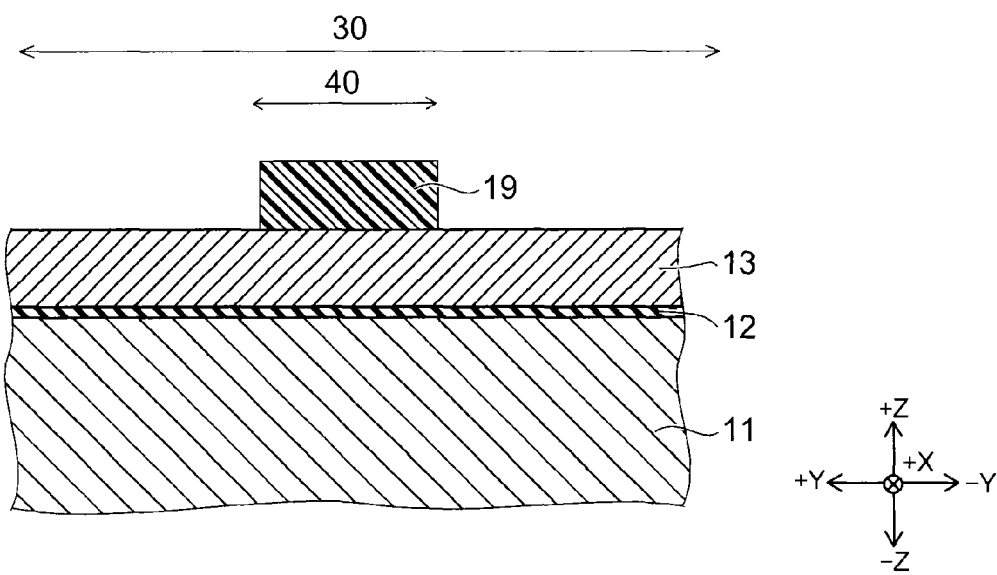

As shown in FIGS. 5A and 5B, a resist pattern 19 covering the region 40 is formed. For example, a resist is coated onto the conductive film 13; and the portions of the cell region 20 and the peripheral region 30 other than the region 40 are removed.

Figure 6A:
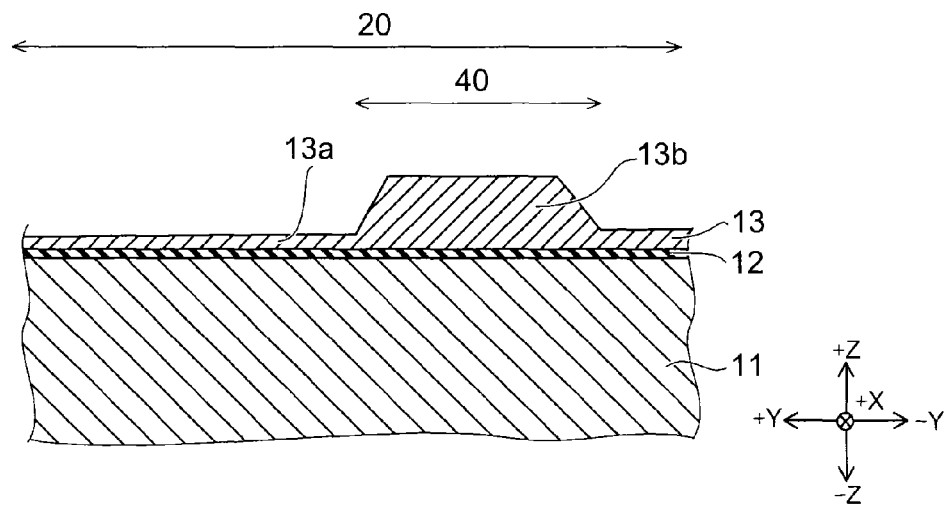
Figure 6B:
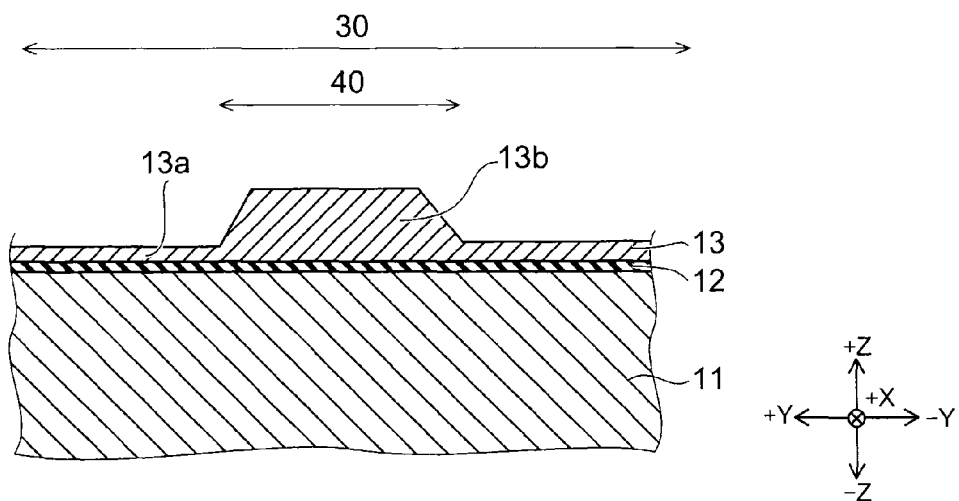

As shown in FIGS. 6A and 6B, the conductive film 13a and the conductive film 13b are formed. Namely, the conductive film 13 is etched by, for example, RIE using the resist pattern 19 as a mask. The etching is performed such that the thickness of the conductive film 13 of the portions of the cell region 20 and the peripheral region 30 other than the region 40 is not more than 15 nm and favorably 5 nm to 10 nm. By controlling the etching conditions, the Y-direction side surface of the conductive film 13 directly under the resist pattern 19 is tapered. In other words, the Y-direction width of the conductive film 13 directly under the resist pattern 19 increases downward. Subsequently, the resist pattern 19 is removed. Thereby, the conductive film 13b having the thickness of 30 nm is formed in the region 40; and the conductive film 13a having the thickness of 5 nm to 10 nm is formed in the regions other than the region 40. In other words, the formation is performed such that the thickness of the conductive film 13a is thinner than the thickness of the conductive film 13b. In other words, the upper surface of the conductive film 13a is formed to be lower than the upper surface of the conductive film 13b.

Figure 7A:
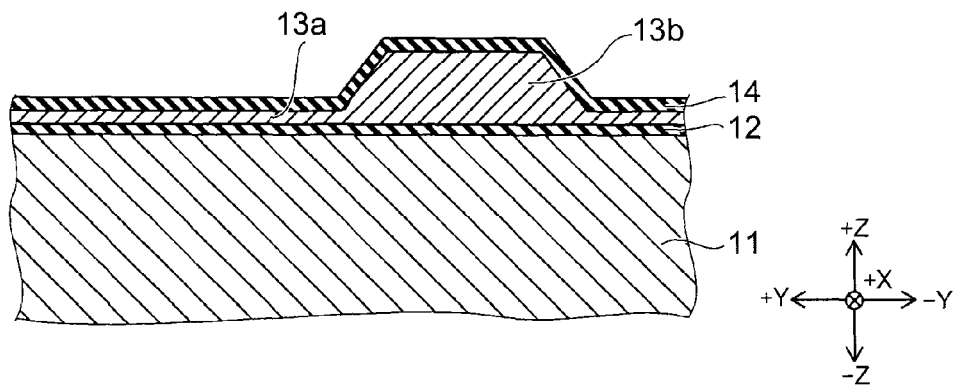
Figure 7B:
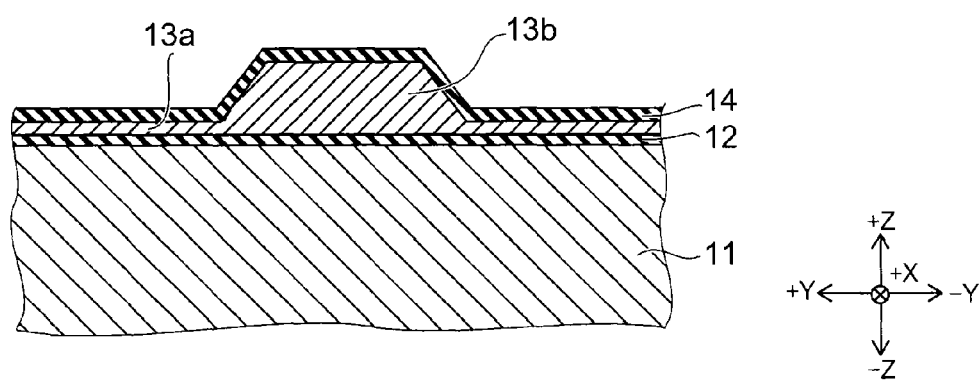

As shown in FIGS. 7A and 7B, the insulating film 14 (the first film) is formed on the conductive films 13a and 13b. For example, $HfO_2$ is deposited on, for example, the semiconductor substrate 11.

Figure 8A:
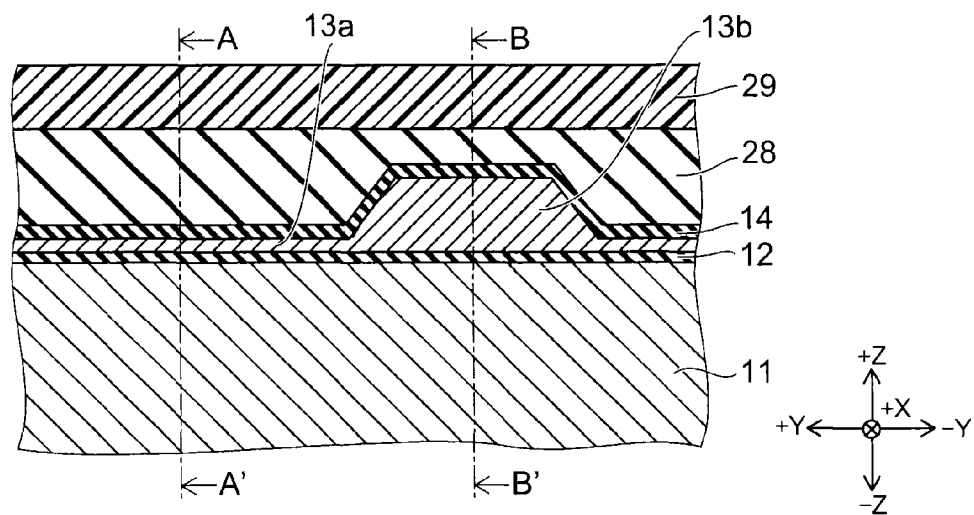
Figure 8B:
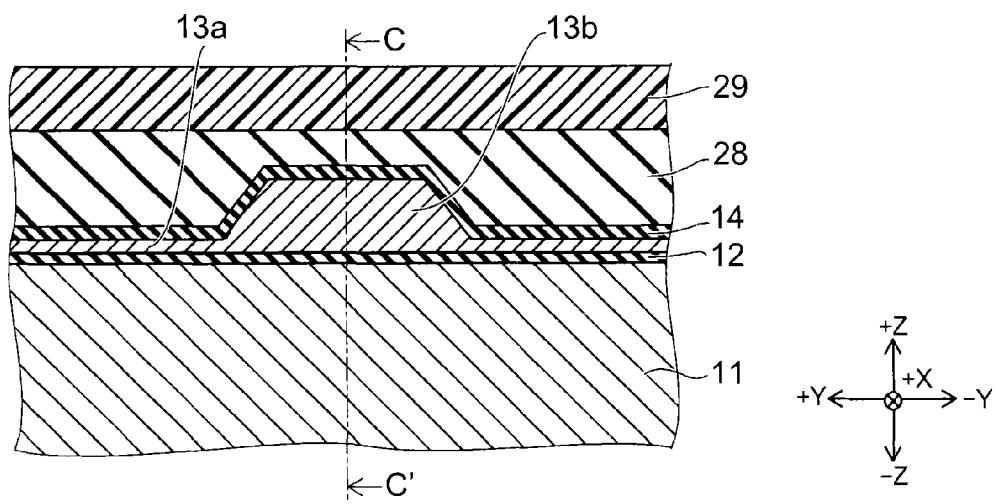

FIG. 8A is a cross-sectional view of a process, showing the manufacturing method in the cell region of the semiconductor device according to the first embodiment; and FIG. 8B is a cross-sectional view of the process, showing the manufacturing method in the peripheral region of the semiconductor device according to the first embodiment.

Figure 9A:
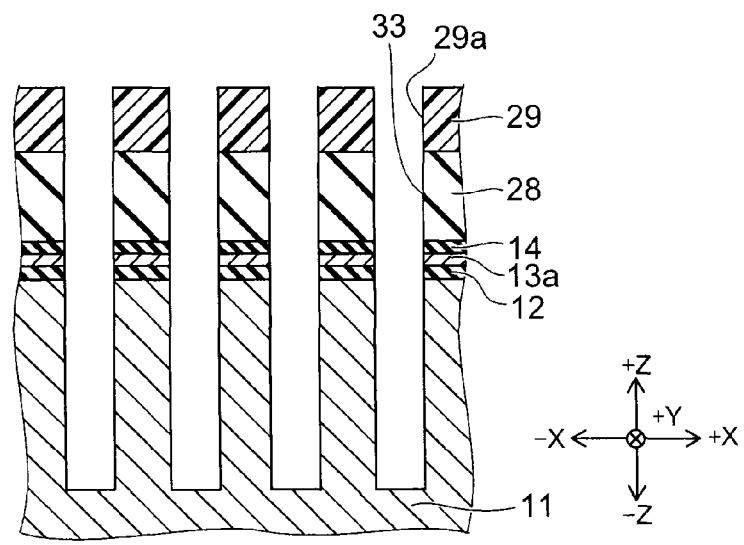
Figure 9B:
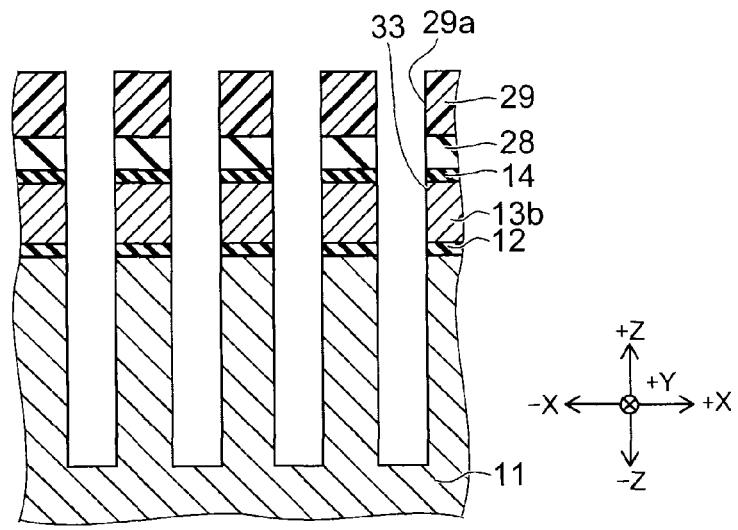
Figure 9C:
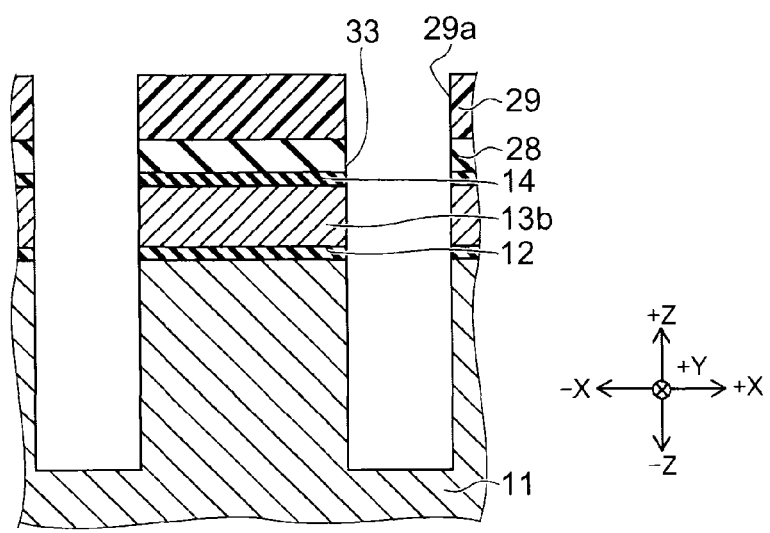

FIGS. 9A to 9C are cross-sectional views showing the method for manufacturing the semiconductor device according to the first embodiment. FIG. 9A is a cross-sectional view along line AA' of FIG. 8A; and FIG. 9B is a cross-sectional view along line BB' of FIG. 8A. FIG. 9C is a cross-sectional view along line CC' of FIG. 8B.

As shown in FIGS. 8A and 8B and FIGS. 9A to 9C, a mask member 28 is deposited on the insulating film 14 to bury the conductive film 13b. Subsequently, the upper surface is planarized. Thereby, the stepped portion between the upper surface of the conductive film 13a and the upper surface of the conductive film 13b does not appear at the upper surface of the mask member 28. Then, for example, a resist is coated onto the mask member 28; and a resist pattern 29 is formed by lithography. The resist pattern 29 is provided in a stripe configuration in the extension direction of the element regions 21.

Then, anisotropic etching of the mask member 28, the insulating film 14, the conductive film 13a, the conductive film 13b, the insulating film 12, and the upper portion of the semiconductor substrate 11 is performed using the resist pattern 29 as a mask. Thereby, a trench 33 is made to pierce the mask member 28, the insulating film 14, the conductive film 13a, the conductive film 13b, and the insulating film 12 to reach the upper portion of the semiconductor substrate 11.

Figure 10A:
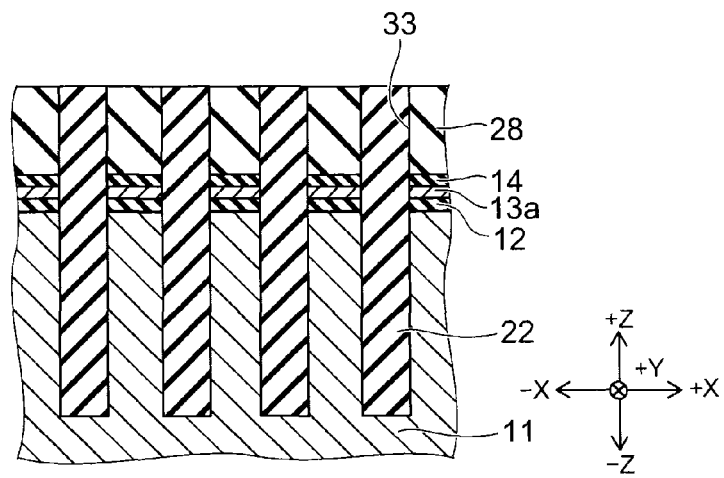
Figure 10B:
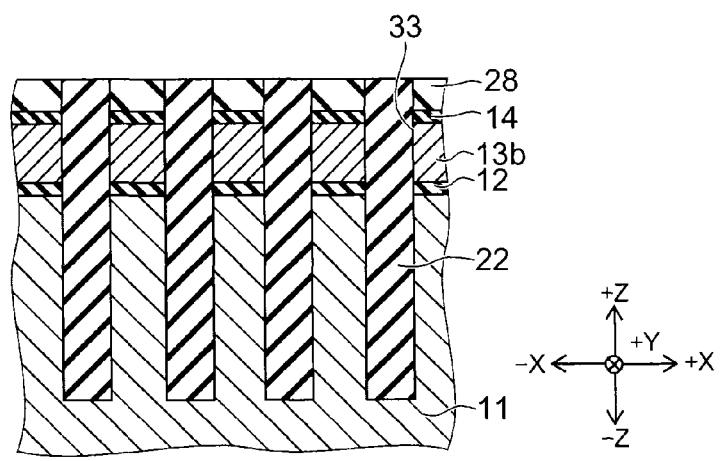
Figure 10C:
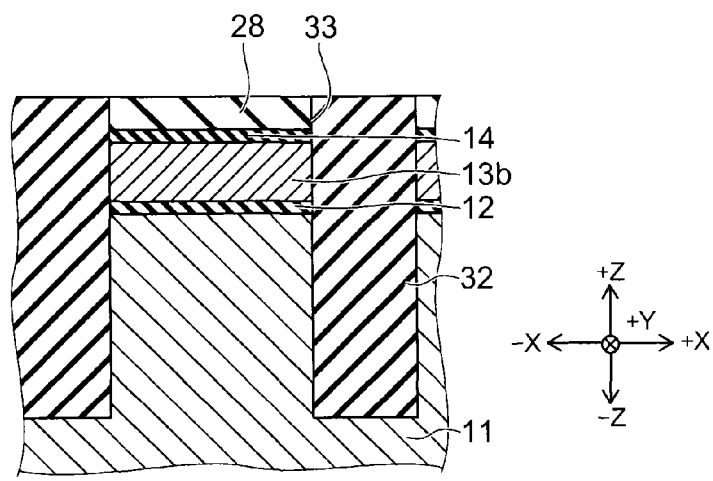

FIGS. 10A and 10B are cross-sectional views of a process, showing the manufacturing method in the cell region of the semiconductor device according to the first embodiment; and FIG. 10C is a cross-sectional view of the process, showing the manufacturing method in the peripheral region of the semiconductor device according to the first embodiment.

As shown in FIGS. 10A and 10B, an insulating material is filled into the interior of the trench 33. For example, silicon oxide is deposited in the interior of the trench 33 and on the mask member 28. Then, the upper surface of the mask member 28 is exposed by performing CMP. Thereby, the STI regions 22 and the STI regions 32 are formed to pierce the mask member 28, the insulating film 14, the conductive film 13a, the conductive film 13b, and the insulating film 12 to reach the upper portion of the semiconductor substrate 11.

Figure 11A:
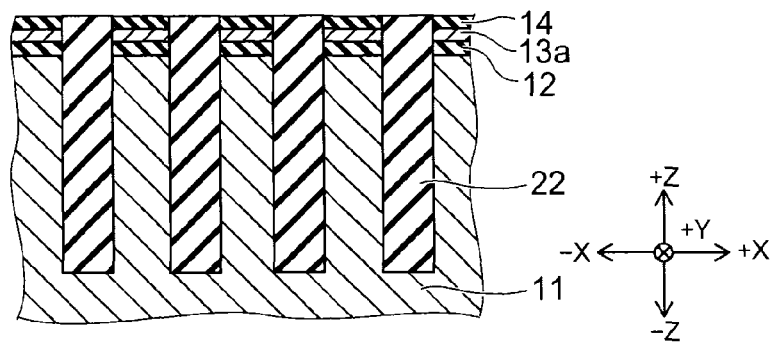
Figure 11B:
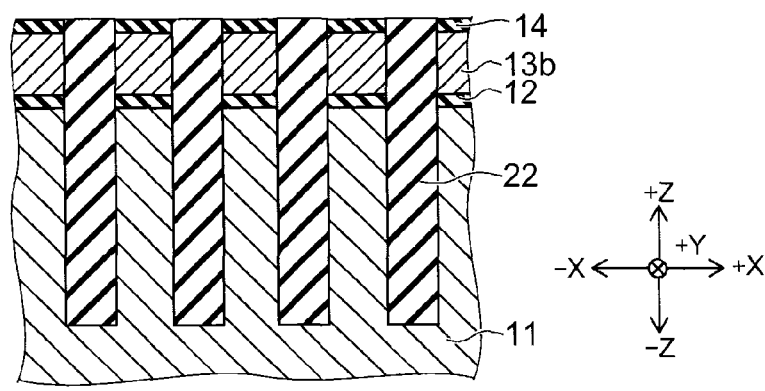
Figure 11C:
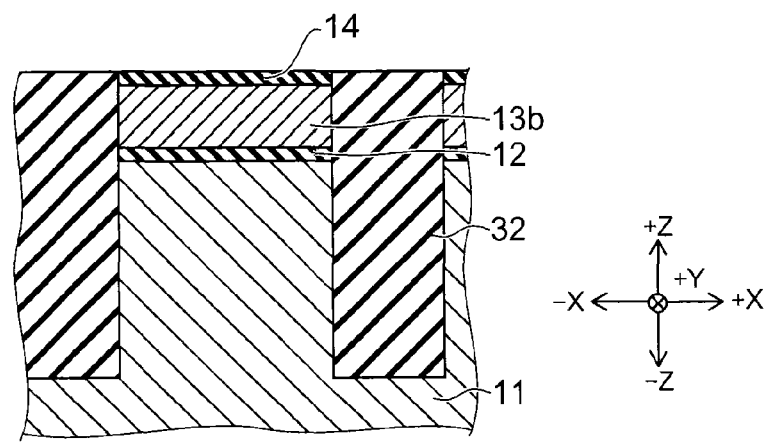

FIGS. 11A and 11B are cross-sectional views of a process, showing the manufacturing method in the cell region of the semiconductor device according to the first embodiment; and FIG. 11C is a cross-sectional view of the process, showing the manufacturing method in the peripheral region of the semiconductor device according to the first embodiment.

As shown in FIGS. 11A to 11C, the mask member 28 is removed; and the STI regions 22 and the STI regions 32 are removed until the upper surfaces of the STI regions 22 and the STI regions 32 are the same height as the upper surface of the insulating film 14. Each of the STI regions 22 adjacent to the memory cell transistor 9, the STI regions 22 adjacent to the through-portion 16a and the STI regions 32 may be removed using a mask and like to have a preferable height, whereby Each of the STI regions 22 adjacent to the memory cell transistor 9, the STI regions 22 adjacent to the through-portion 16a and the STI regions 32 have a different height from each other.

Figure 12A:
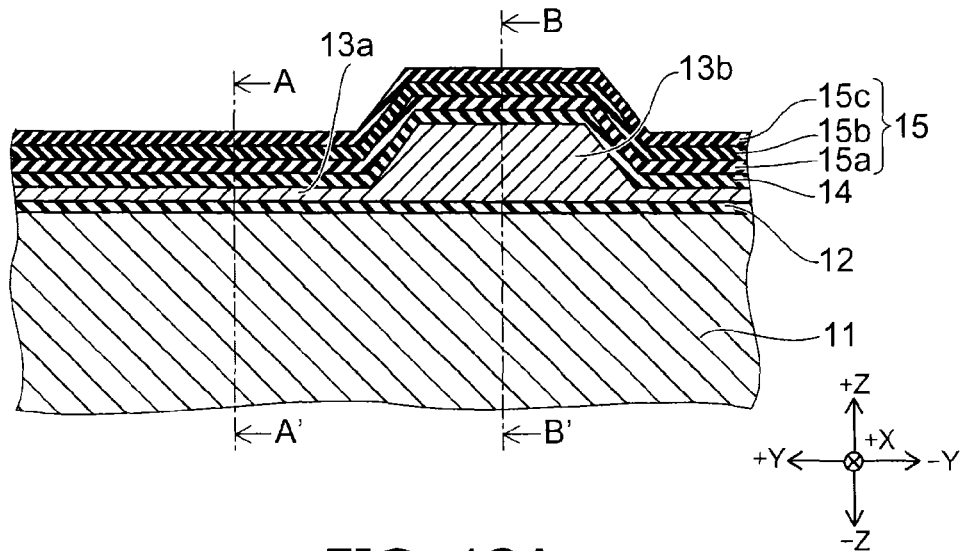
Figure 12B:
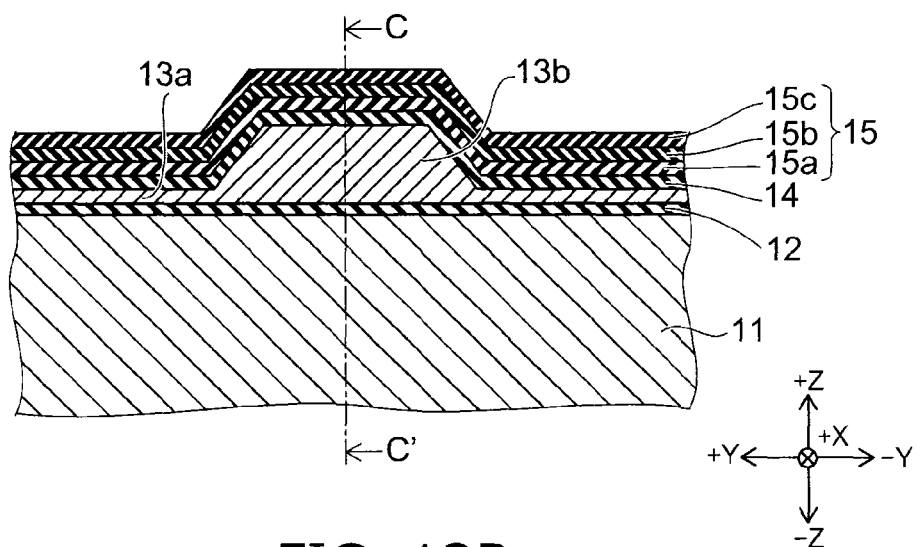

FIG. 12A to FIG. 13C are cross-sectional views of processes, showing the manufacturing method in the cell region of the semiconductor device according to the first embodiment. FIG. 12A is a cross-sectional view showing the cell region; and FIG. 12B is a cross-sectional view of the process, showing the peripheral region.

Figure 13A:
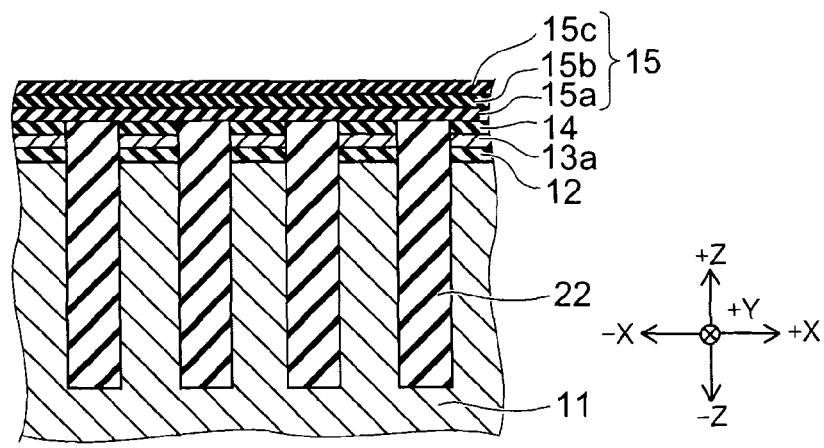
Figure 13B:
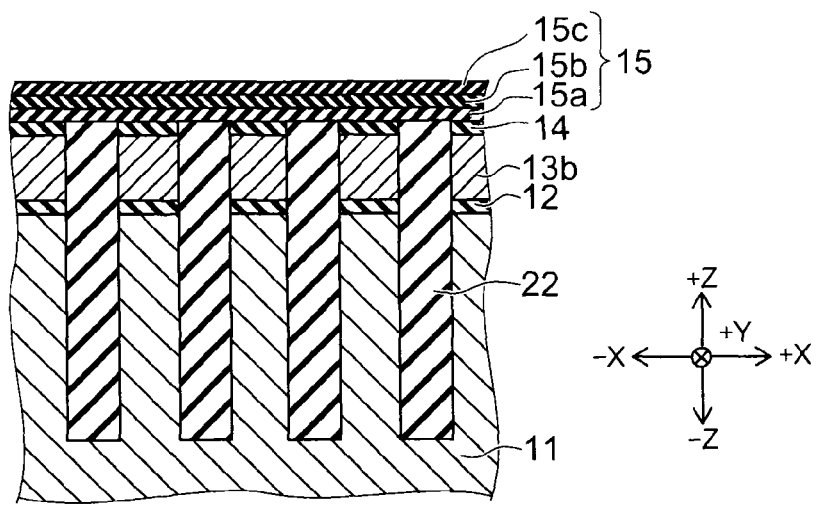
Figure 13C:
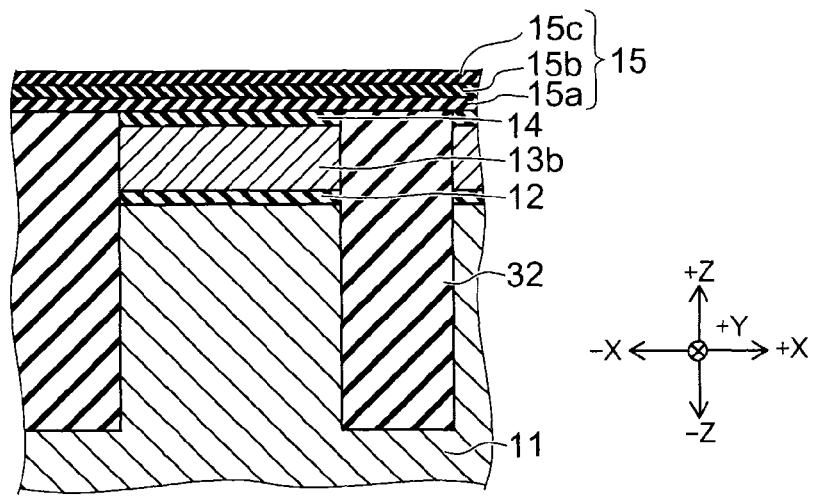

FIG. 13A is a cross-sectional view illustrated by line AA' of FIG. 12A; FIG. 15B is a cross-sectional view illustrated by line BB' of FIG. 12A; and FIG. 13C is a cross-sectional view illustrated by line CC' of FIG. 12B.

As shown in FIGS. 12A and 12B and FIGS. 13A to 13C, the inter-poly dielectric film 15 (the second film) is formed on the insulating film 14 and on the STI regions 22 or the STI regions 32. The inter-poly dielectric film 15 is, for example, a stacked film and includes, from the lowest layer, the silicon oxide film 15a, the hafnium oxide film 15b, and the tantalum oxide film 15c.

Figure 14A:
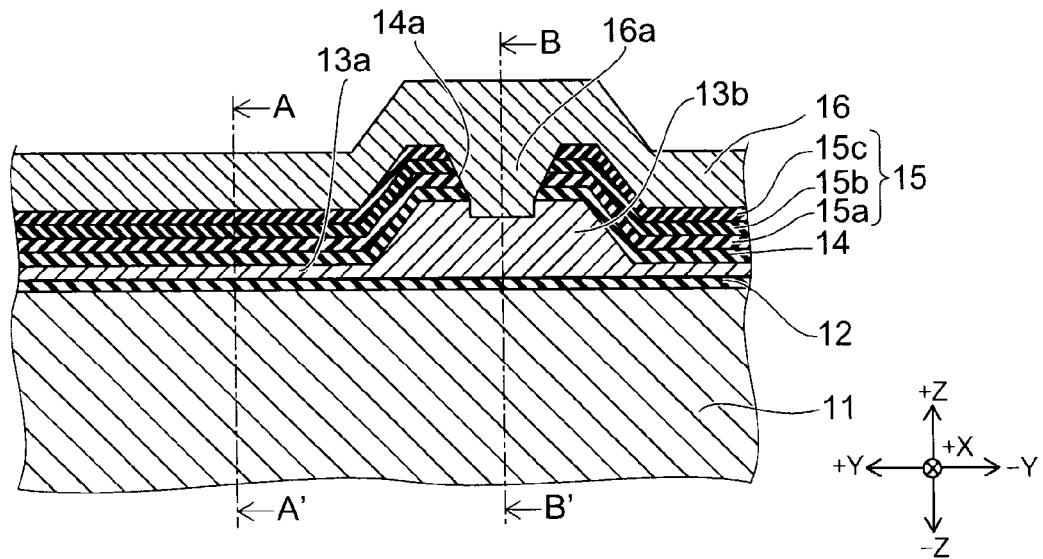
Figure 14B:
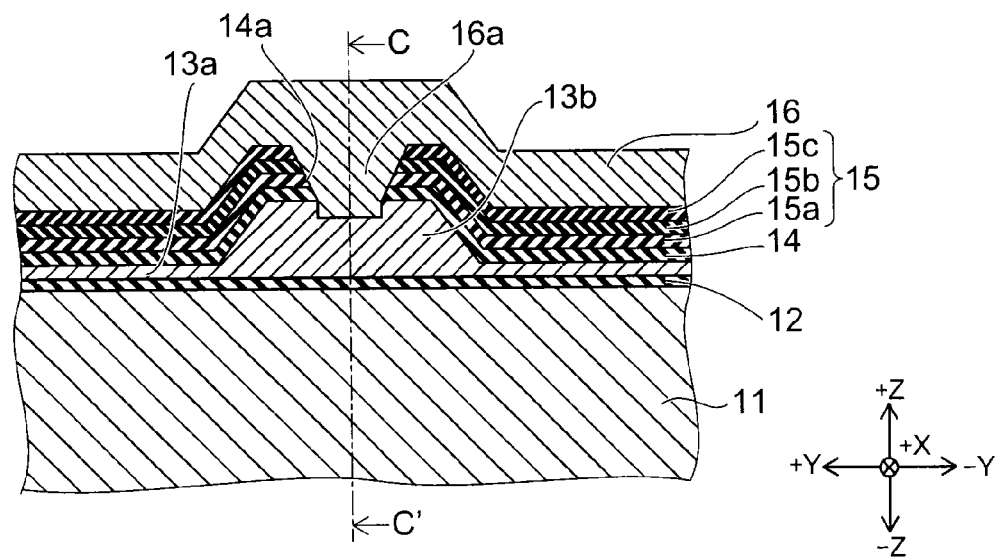

FIG. 14A to FIG. 15C are cross-sectional views of processes, showing the method for manufacturing the semiconductor device according to the first embodiment. FIG. 14A is a cross-sectional view showing the cell region; and FIG. 14B is a cross-sectional view showing the peripheral region.

Figure 15A:
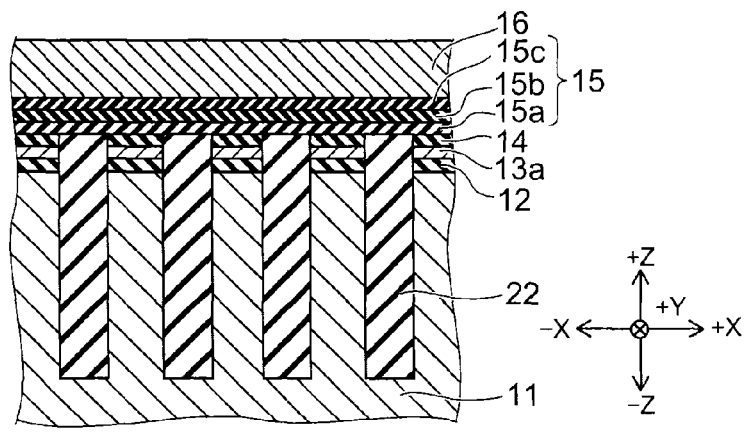
Figure 15B:
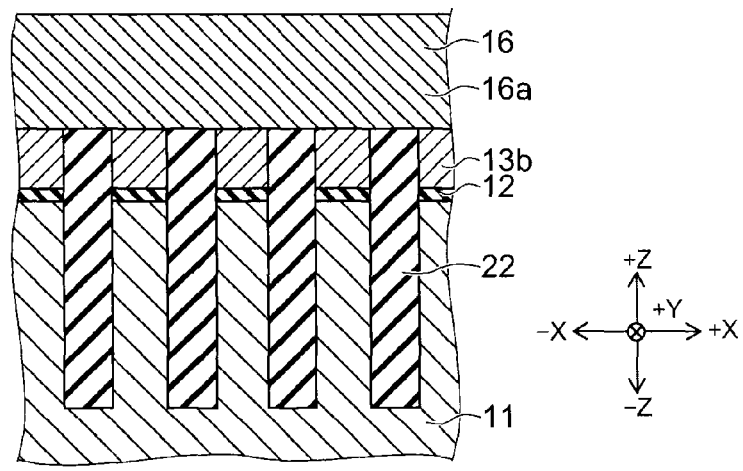
Figure 15C:
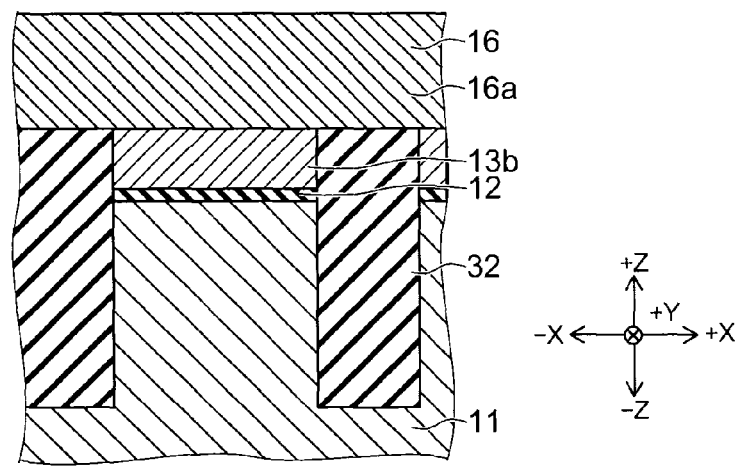

FIG. 15A is a cross-sectional view of the process illustrated by line AA' of FIG. 14A; FIG. 15B is a cross-sectional view of the process illustrated by line BB' of FIG. 14A; and FIG. 15C is a cross-sectional view of the process illustrated by line CC' of FIG. 14B and shows the manufacturing method in the peripheral region of the semiconductor device according to the first embodiment.

As shown in FIGS. 14A and 14B and FIGS. 15A to 15C, an opening 14a is made by removing the inter-poly dielectric film 15 and the insulating film 14 that are on the conductive film 13b by, for example, RIE. The width of the opening 14a in the Y-direction is narrower than the width of the upper surface of the conductive film 13b in the Y-direction. Then, the conductive film 16 is formed by depositing a conductive material, e.g., polysilicon, onto the inter-poly dielectric film 15 to fill the opening 14a and contact the conductive film 13b. The portion of the conductive film 16 in the opening 14a is called the through-portion 16a. Thereby, the conductive film 13b is connected to the conductive film 16 in the selection gate 24a, the selection gate 24b, and the selection gate 34.

Figure 16A:
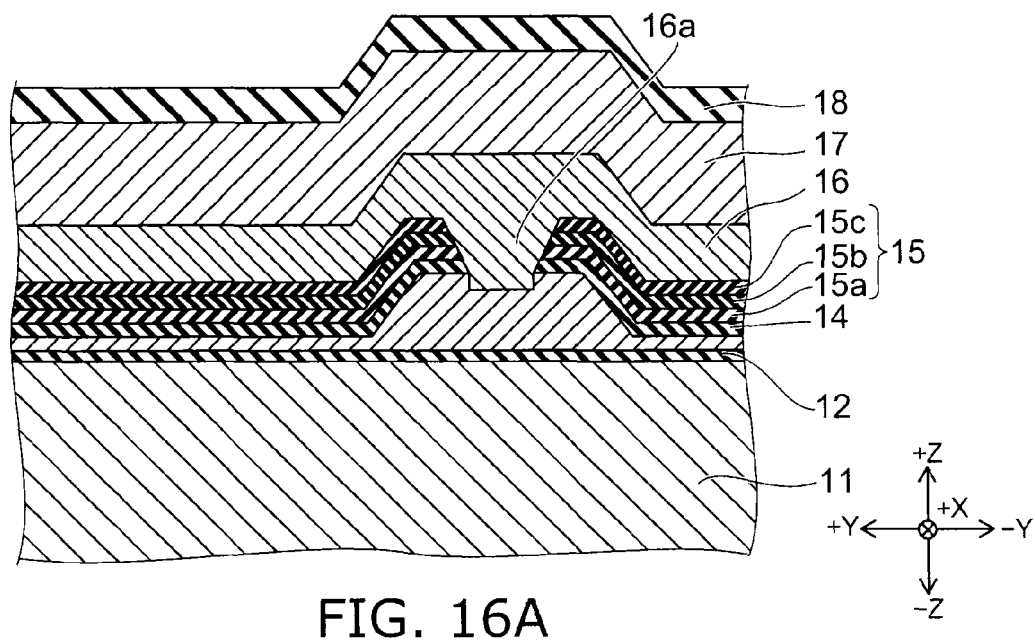
Figure 16B:
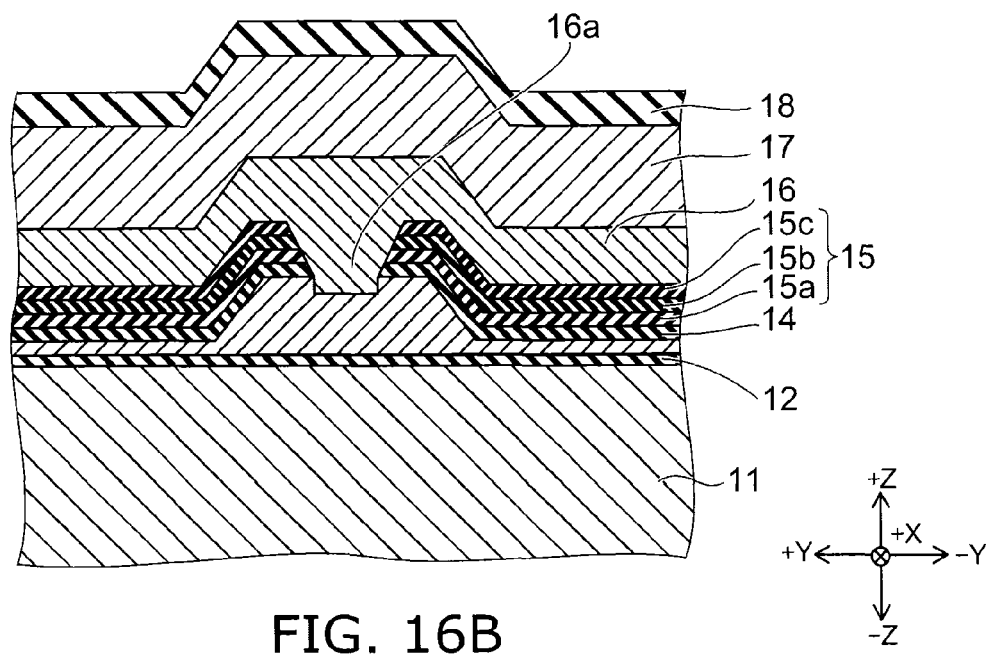

FIG. 16A is a cross-sectional view of a process, showing the manufacturing method in the cell region of the semiconductor device according to the first embodiment; and FIG. 16B is a cross-sectional view of the process, showing the manufacturing method in the peripheral region of the semiconductor device according to the first embodiment.

As shown in FIGS. 16A and 16B, the metal film 17 is formed by depositing a metal material, e.g., tungsten (W), on the conductive film 16. Continuing, the mask member 18 is formed by depositing a mask material on the metal film 17.

Then, a resist pattern is formed by coating a resist onto the mask member 18 and by performing patterning. Continuing, etching of the metal film 17, the conductive film 16, the inter-poly dielectric film 15, the insulating film 14, the conductive film 13a, and the conductive film 13b is performed using the resist pattern as a mask.

As shown in FIGS. 1A to 3D, the semiconductor device 1 including the memory cell transistors 9 and the selection transistors 10a, 10b, and 35 is formed.

Effects of the embodiment will now be described.

In the semiconductor device 1 according to the embodiment, the thickness of the conductive film 13a that is used to form the floating gate of the memory cell transistor 9 in the cell region 20 can be reduced. Thereby, the capacitive coupling between adjacent floating gates can be reduced; and proximity effects can be suppressed. In the case where the thickness of the conductive film 13a is not more than 3 times the thickness of the tunneling insulating film 12, the proximity effects can be reduced markedly. Also, in the case where the thickness of the conductive film 13a is not more than 10 nm, the proximity effects can be reduced markedly.

The thickness of the conductive film 13b of the selection gate 24a, the selection gate 24b, and the selection gate 34 can be thicker than the thickness of the floating gate of the memory cell transistor 9 in the cell region 20. Thereby, the opening 14a reaching the tunneling insulating film 12 by extending through the conductive film 13b during the etching of the inter-poly dielectric film 15 and the insulating film 14 can be suppressed. In the case where the conductive film 13b is thin and the resistance is high for the selection transistors 10a and 10b of the cell region 20 and the selection transistor 35 of the peripheral region 30, there are cases where operations of the gate electrodes are delayed. However, in the semiconductor device 1, the delay of the operations of the gate electrodes can be suppressed because the conductive film 13b is thick.

The stacked film included in the gate electrode of the memory cell transistor 9 and the selection gates 24a, 24b, and 34 is formed by stacking films of the same materials. Therefore, because the films of the same materials can be formed simultaneously and patterned simultaneously, the manufacturing processes can be reduced.

Although the conductive film 13 is formed by depositing polysilicon, this is not limited thereto. The conductive film 13 may be a metal including tungsten or titanium. In the case where a pattern that is finer than the lithography limit is made as the trench 33, sidewall transfer patterning may be used to form the STI regions 22 and the STI regions 32.

The inter-poly dielectric film 15 may be a stacked film of silicon nitride, silicon oxide, and a high dielectric constant film including at least one rare earth oxide selected from the group consisting of aluminum oxide ($Al_2O_3$), hafnium oxide ($HfO_2$), hafnium aluminum oxide (HfAlO), lanthanum oxide (LaO), lanthanum aluminate (LaAlO), and manganese oxide (MnO). Although the word line 23 is a stacked film of the conductive film 16 including polysilicon and the metal film including tungsten (W), the word line 23 may be a stacked film of the conductive film 16 including polysilicon and a silicide film of nickel (Ni), cobalt (Co), molybdenum (Mo), tungsten (W), etc.

COMPARATIVE EXAMPLE

A comparative example of the first embodiment will now be described.

Figure 17A:
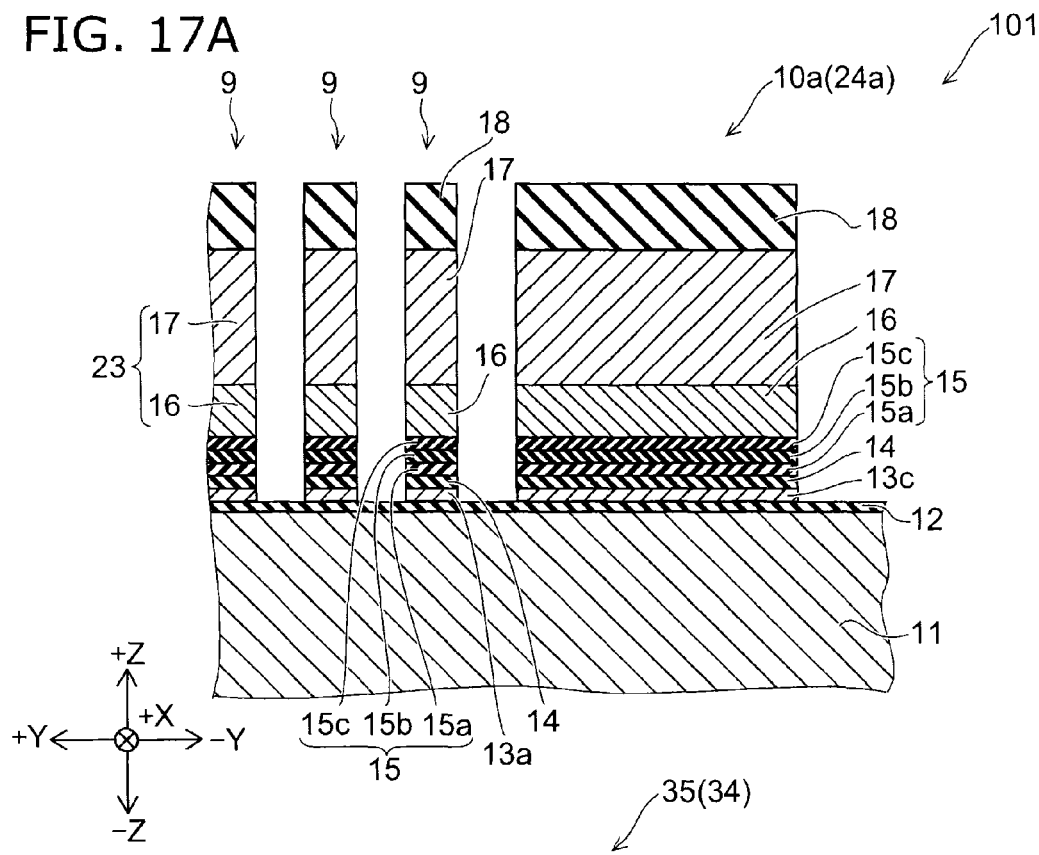
FIGS. 17A to 17B are schematic cross-sectional views illustrating of the semiconductor device according to a comparative example of the first embodiment.
Figure 17B:
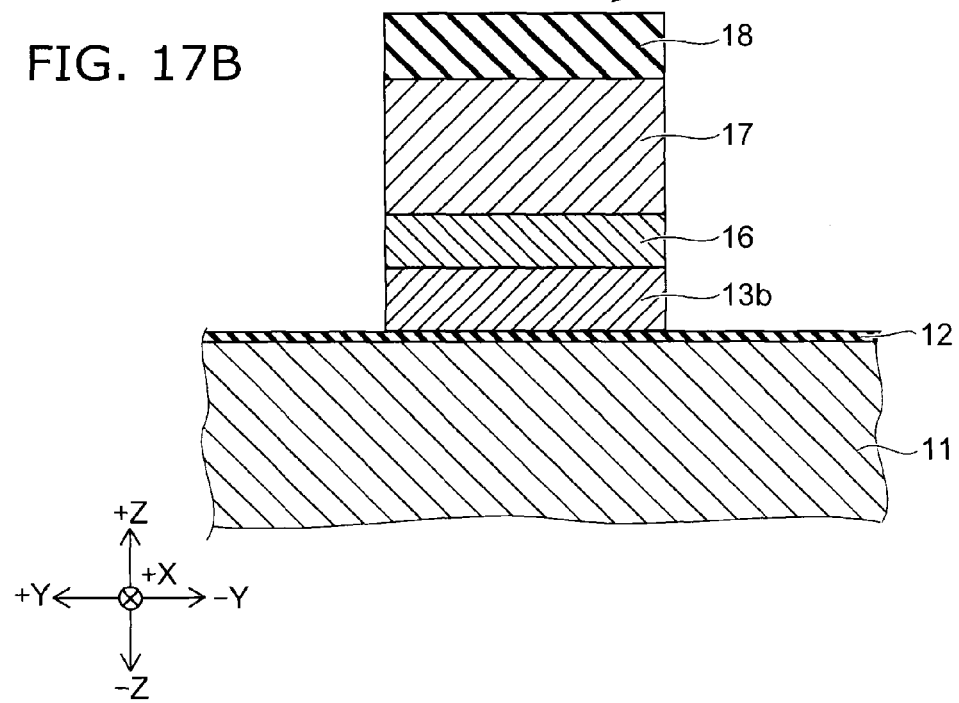

FIG. 17A is a cross-sectional view of a process, showing the manufacturing method in the cell region of the semiconductor device according to the comparative example of the first embodiment; and FIG. 17B is a cross-sectional view of the process, showing the manufacturing method in the peripheral region of the semiconductor device according to the comparative example of the first embodiment.

In the semiconductor device 101 according to the comparative example as shown in FIGS. 17A and 17B, a conductive film 13c of the selection gate 24a in the cell region 20 has the same thickness as the conductive film 13a of the memory cell transistor 9. Unlike the semiconductor device 1 described above, the conductive film 16 does not have the through-portion 16a.

The insulating film 14 and the inter-poly dielectric film 15 are not formed in the selection gate 34 in the peripheral region 30. The conductive film 16 is formed on the conductive film 13b.

In the comparative example, the conductive film 13c is thin; and the contact surface area with the inter-poly dielectric film 15 is reduced. Accordingly, it is necessary for the inter-poly dielectric film 15 to be a film having a high dielectric constant to suppress the decrease of the coupling ratio.

The stacked film included in the gate electrode of the memory cell transistor 9 and the selection gates 24a and 24b has a configuration that is different from that of the stacked film included in the selection gate 34. Therefore, it is necessary to separately pattern the cell region 20 and the peripheral region 30; and the manufacturing processes increase.

Because the conductive film 13c of the selection gate 24a is thin, it is difficult to make the opening 14a in the insulating film 14 and the inter-poly dielectric film 15 without extending through the conductive film 13c. Therefore, it is difficult to connect the conductive film 13c and the conductive film 16.

The selection transistor 10a also has a memory cell structure including a floating gate; the threshold fluctuates due to the programming and the erasing; and the operations become unstable.

To stabilize the operations, it is necessary to provide a structure not including the floating gate by removing the selection transistor 10a and forming a new structure that does not include a floating gate; and many manufacturing processes are necessary.

Second Embodiment

Figure 18A:
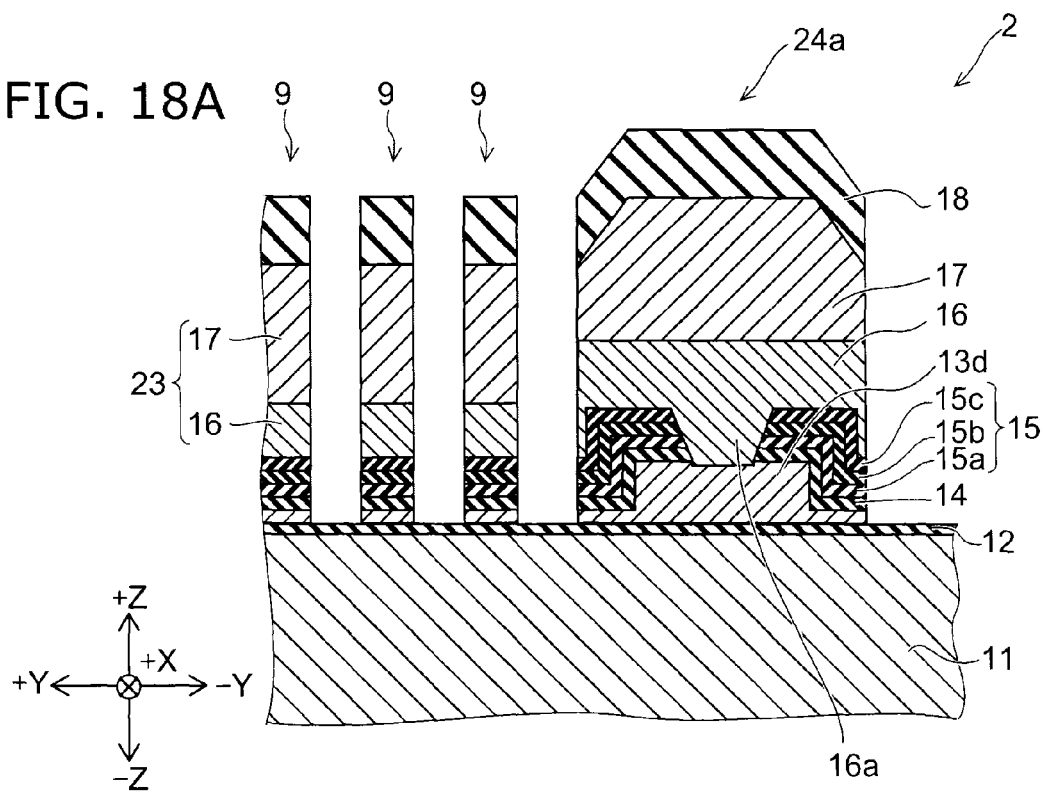
FIGS. 18A and 18B are schematic cross-sectional views illustrating one example of a semiconductor device according to a second embodiment.
Figure 18B:
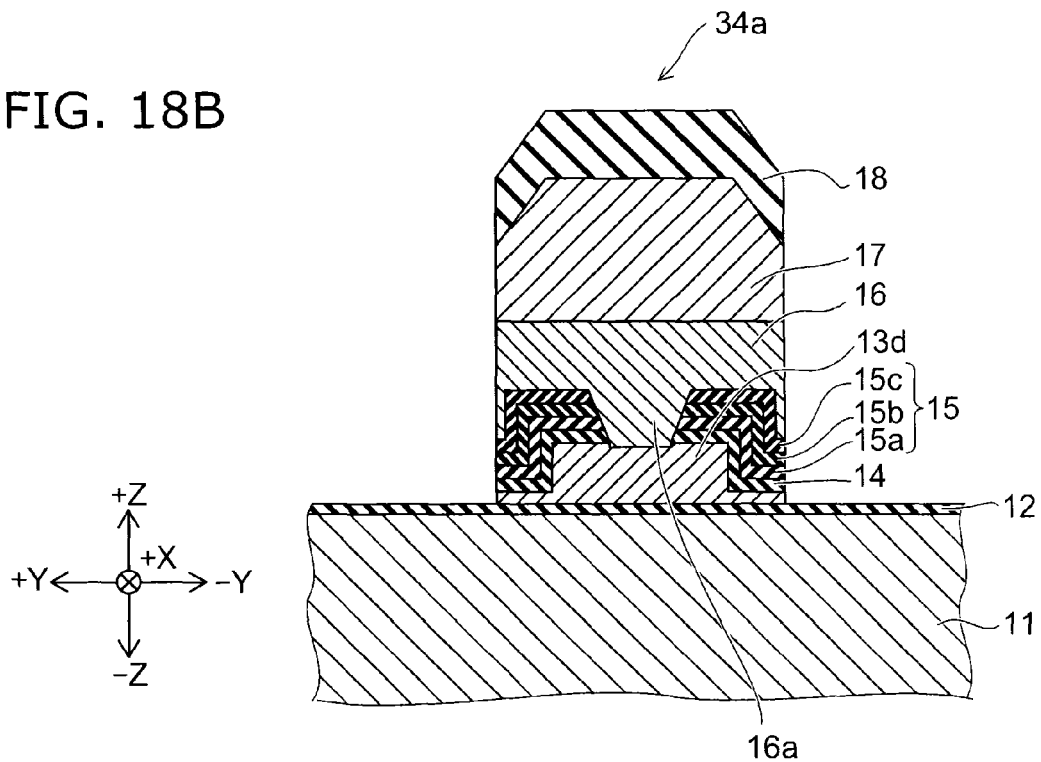

FIG. 18A is a cross-sectional view showing one example of the cell region of the semiconductor device according to the second embodiment; and FIG. 18B is a cross-sectional view showing one example of the peripheral region of the semiconductor device according to the second embodiment.

As shown in FIGS. 18A and 18B, a conductive film 13d is provided on the tunneling insulating film 12 in the selection gate 24a and the selection gate 34 of the semiconductor device 2 according to the embodiment. The side surface of the conductive film 13d facing the Y direction is not tapered, but is a step portion. In other words, the width of the conductive film 13b in the step portion in the Y direction is the same width. Otherwise, the configuration of the embodiment is similar to that of the first embodiment described above.

A method for manufacturing the semiconductor device 2 according to the second embodiment will now be described.

FIG. 19A to FIG. 24A are cross-sectional views of processes, showing one example of the manufacturing method in the cell region of the semiconductor device according to the second embodiment; and FIG. 19B to FIG. 24B are cross-sectional views of the processes, showing one example of the manufacturing method in the peripheral region of the semiconductor device according to the second embodiment.

Figure 19A:
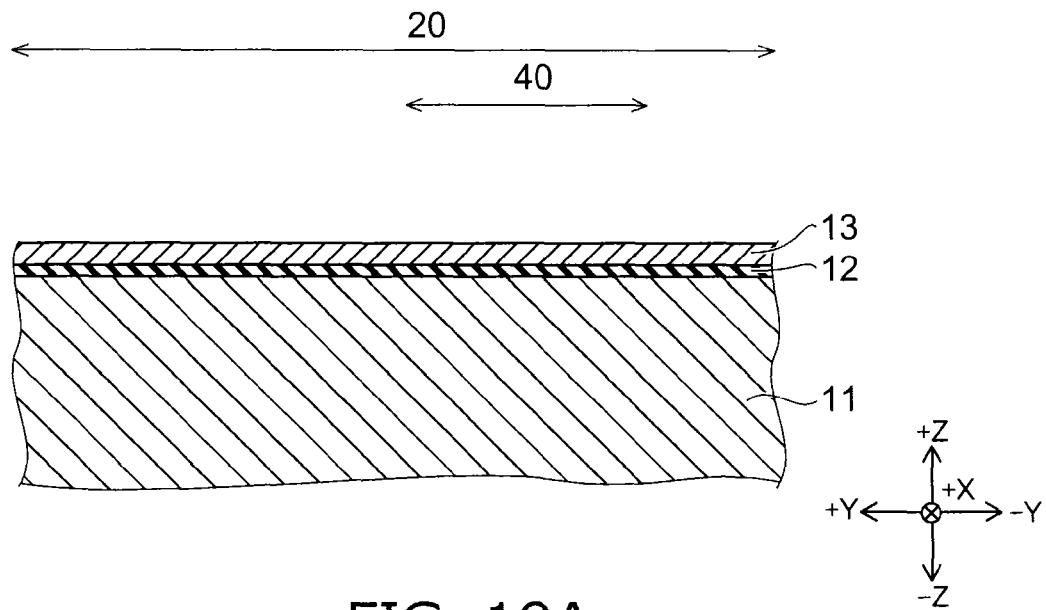
FIGS. 19A to 24B are schematic cross-sectional views illustrating one example of a manufacturing method of the semiconductor device according to the second embodiment.
Figure 19B:
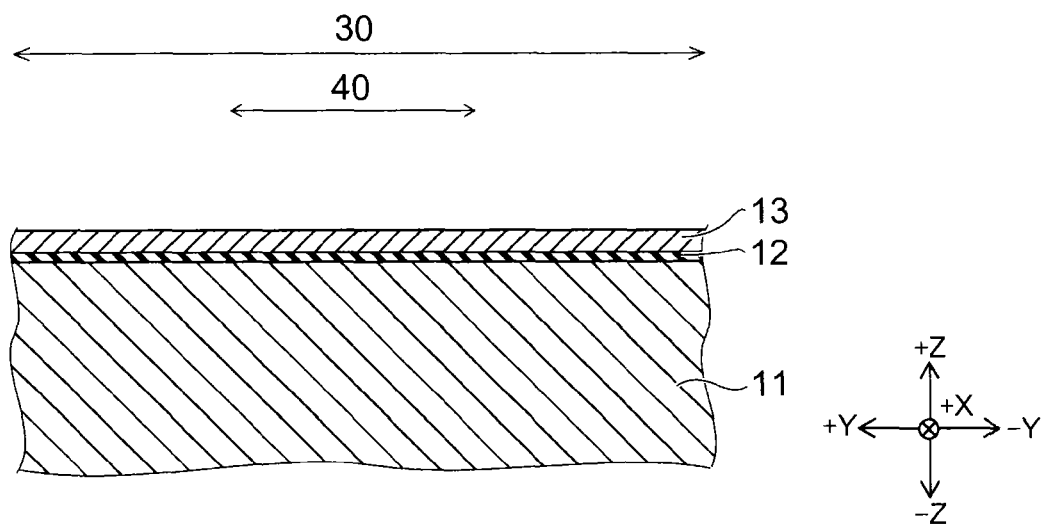

As shown in FIGS. 19A and 19B, the semiconductor substrate 11, e.g., a silicon substrate, is prepared. The cell region 20 and the peripheral region 30 are set to be included in the semiconductor substrate 11. The region 40 where the selection gate is formed also is set in the cell region 20 and the peripheral region 30. Then, the tunneling insulating film 12, e.g., a silicon oxide film, is formed on the semiconductor substrate 11. Subsequently, the conductive film 13 (the fifth conductive film) is formed by depositing a conductive material, e.g., polysilicon, on the tunneling insulating film 12. The thickness of the conductive film 13 is, for example, 15 nm and favorably 5 nm to 10 nm.

Figure 20A:
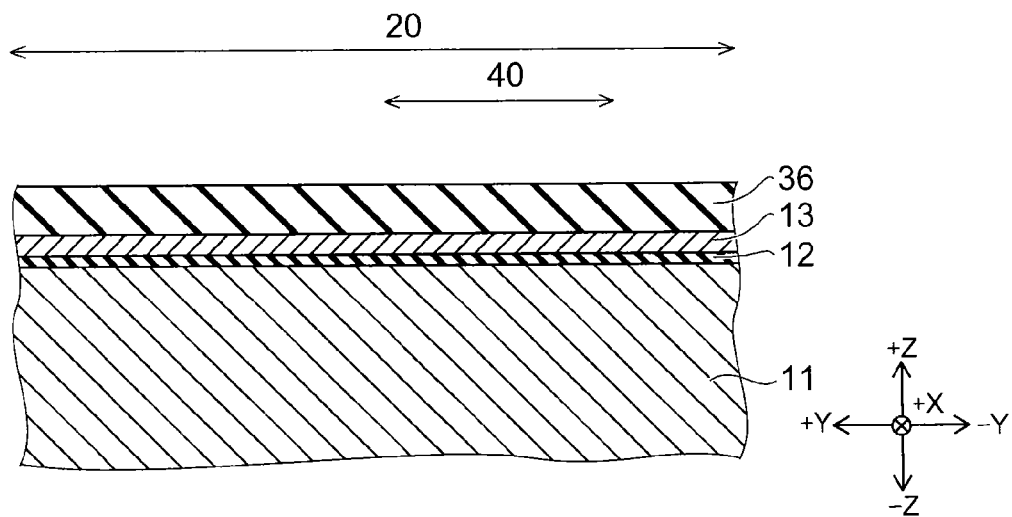
Figure 20B:
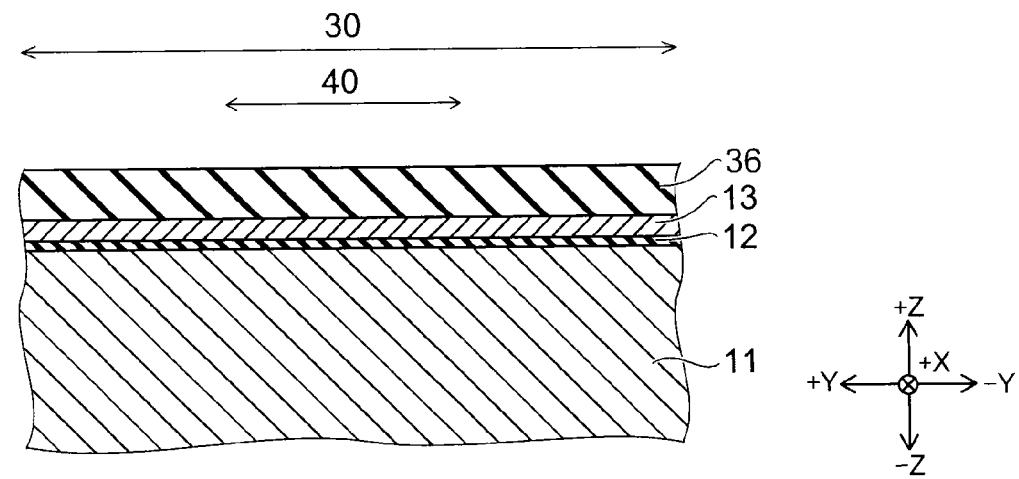

As shown in FIGS. 20A and 20B, a stopper film 36 is formed on the conductive film 13. The stopper film 36 is formed by, for example, depositing silicon oxide on the conductive film 13.

Figure 21A:
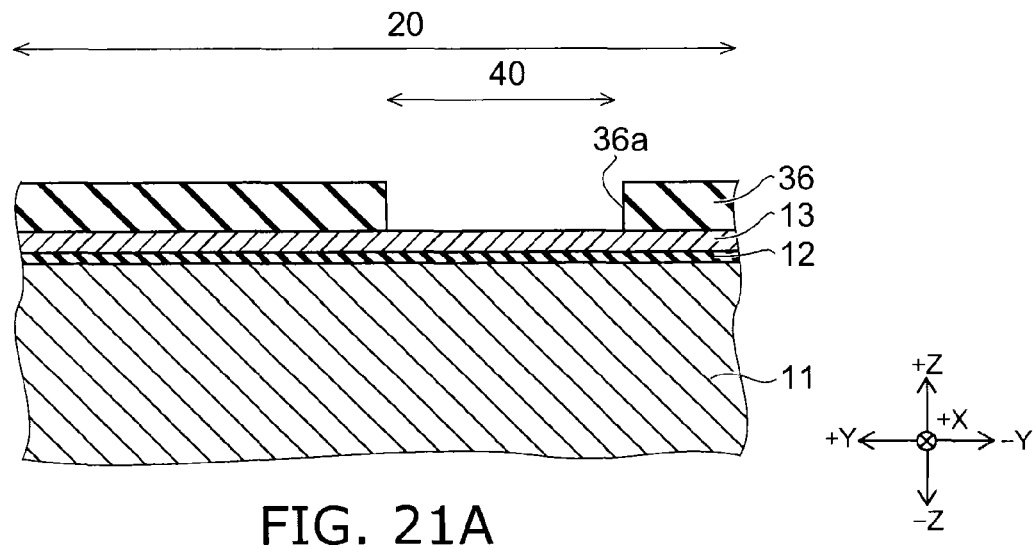
Figure 21B:
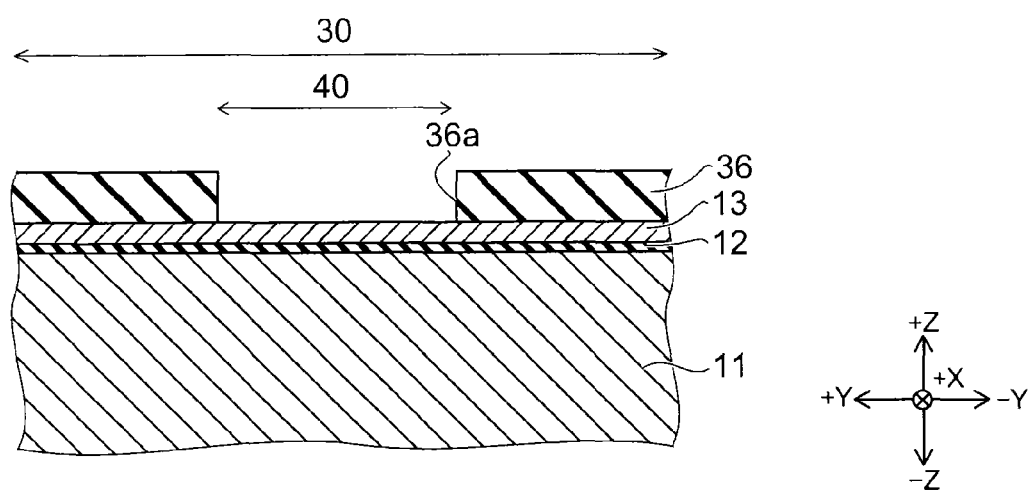

As shown in FIGS. 21A and 21B, an opening 36a is made by removing the portion of the stopper film 36 corresponding to the region 40 by lithography.

Figure 22A:
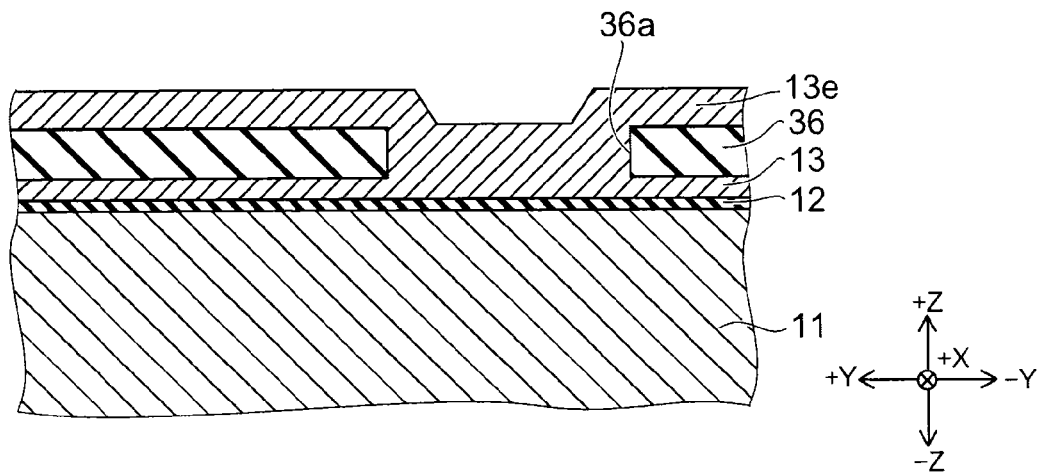
Figure 22B:
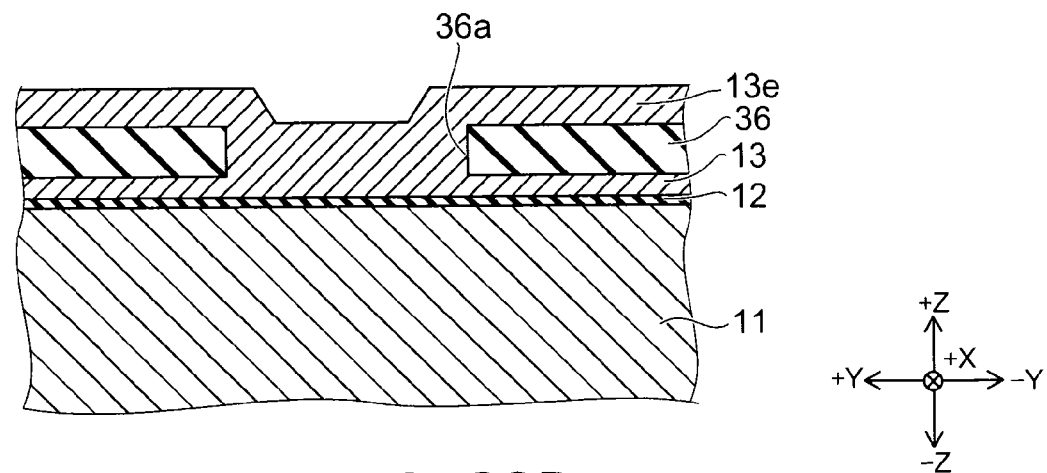

As shown in FIGS. 22A and 22B, after wet etching by dilute hydrofluoric acid to remove the native oxide film, a conductive film 13e (a sixth conductive film) is formed by depositing a conductive material, e.g., polysilicon, onto the stopper film 36 to fill the opening 36a and contact the conductive film 13. It is sufficient for the conductive film 13e to be a conductive film that has a small contact resistance with the conductive film 13 and good selectivity with the stopper film 36 in RIE.

Figure 23A:
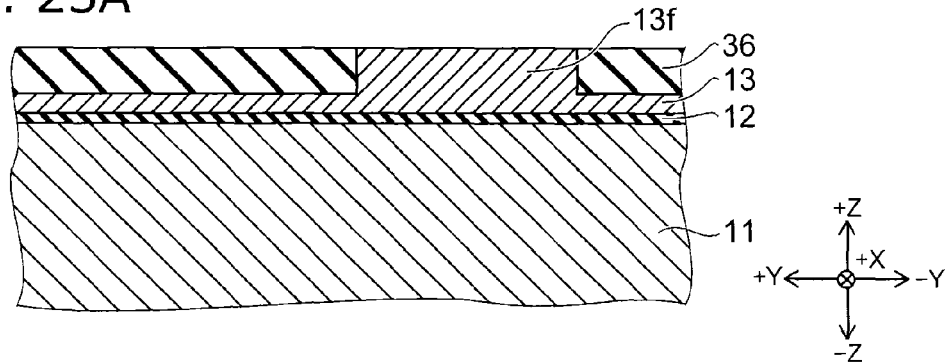
Figure 23B:
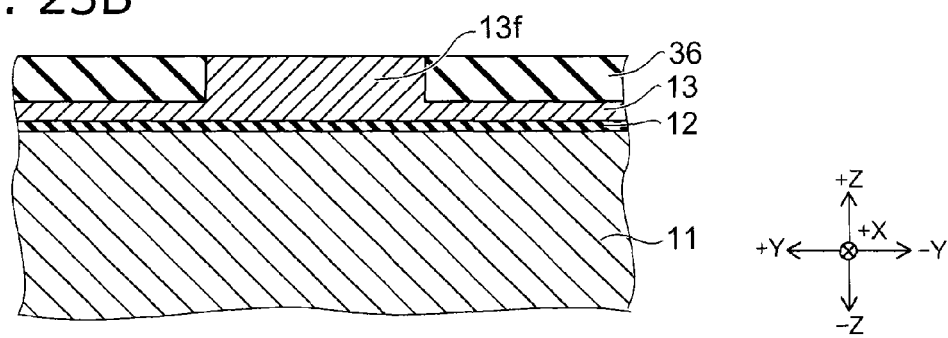

As shown in FIGS. 23A and 23B, the conductive film 13e is planarized by, for example, CMP using the stopper film 36 as a stopper. Thereby, a conductive film 13f is formed in the interior of the opening 36a.

Figure 24A:
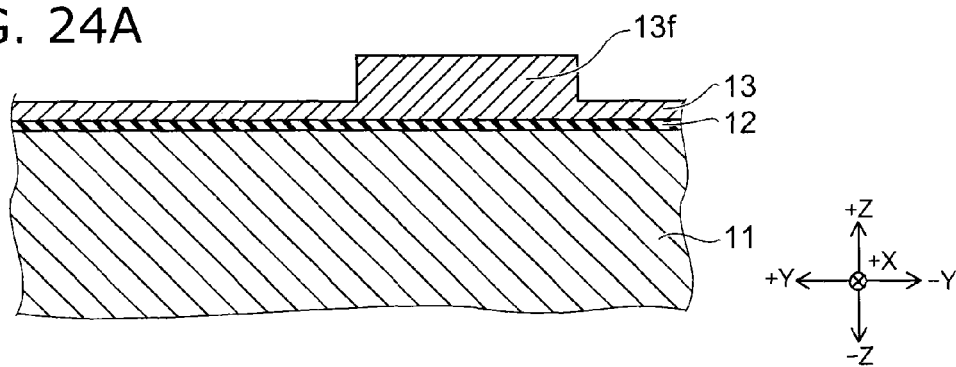
Figure 24B:
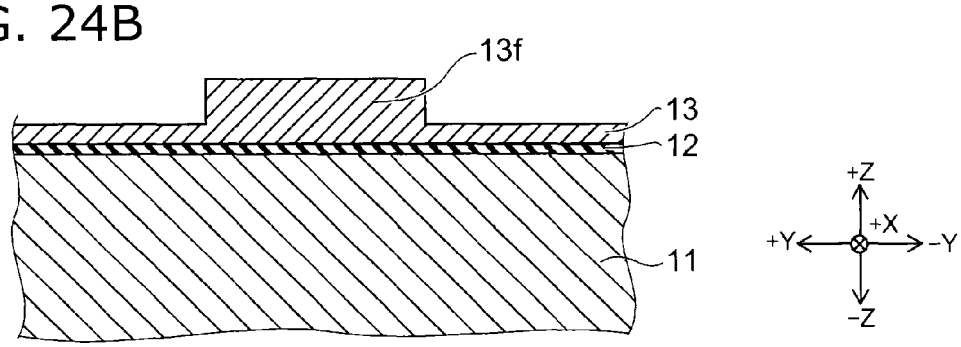

As shown in FIGS. 24A and 24B, the stopper film 36 is removed by wet etching.

Continuing, the processes shown in FIGS. 7A and 7B to FIGS. 16A and 16B are implemented. Thus, as shown in FIGS. 18A and 18B, the semiconductor device 2 is formed.

Effects of the embodiment will now be described.

Compared to the method for manufacturing the semiconductor device 1 according to the first embodiment described above, the semiconductor device 2 of the embodiment has one more lithography process to make the opening 36a in the stopper film 36. Also, the process of depositing the stopper film 36 and the conductive film 13e and the CMP process to form the conductive film 13f are added. However, the thickness of the conductive film 13a can be controlled with higher precision by controlling by deposition than by controlling by RIE. Thereby, the proximity effects can be suppressed. Otherwise, the effects of this modification are similar to those of the first embodiment described above.

According to the embodiments described above, a semiconductor device and a method for manufacturing the semiconductor device for which downscaling can be performed can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
at least one NAND string provided on an element region extending in a first direction in a surface of a semiconductor substrate,
the NAND string comprising:
a memory cell transistor having a stacked gate structure including a first insulating film provided part of the element region, a first conductive film provided on the first insulating film, a second insulating film provided on the first conductive film, and a second conductive film provided on the second insulating film; and
a select transistor provided to be separated from the memory cell transistor on the element region, the select transistor having a stacked gate structure including a third insulating film provided on the other part of the element region, a third conductive film provided on the third insulating film, a fourth insulating film provided on the third conductive film, and a fourth conductive film provided on the fourth insulating film, the select transistor having a through-portion in the fourth insulating film to electrically connect the third conductive film and the fourth conductive film,
wherein the memory cell transistor and the select transistor are arranged in the first direction, and the third conductive film is thicker than the first conductive film, and
wherein a lower surface of the third conducting film is provided in the same plane as a lower surface of the first conducting film.

2. The device according to claim 1, wherein an upper surface of the third conductive film is positioned higher than an upper surface of the first conductive film.

3. The device according to claim 1, wherein a thickness of the first conductive film is not more than 3 times a thickness of the first insulating film.

4. The device according to claim 1, comprising a plurality of NAND strings,
wherein the semiconductor substrate includes a plurality of element regions and a plurality of insulating regions each extending in the first direction on the surface of the semiconductor substrate, and each of the insulating regions are provided between mutually-adjacent element regions, and each NAND string is provided on any one of the element regions.

5. The device according to claim 1, wherein the third conductive film includes a depression having a depth larger than a thickness of the first conductive film.

6. The device according to claim 4, wherein the second conductive film and the fourth conductive film extend in a second direction orthogonal to the first direction in a plane parallel to the surface of the semiconductor substrate.

7. The device according to claim 6, wherein the second insulating film and the fourth insulating film extend in the second direction.

8. The device according to claim 4, wherein the second insulating film includes a first film provided on the first conductive film, and a second film provided on the first film to extend in the second direction.

9. The device according to claim 8, wherein the second film includes a plurality of insulating films.

10. The device according to claim 1, wherein the first conductive film and the second conductive film include polysilicon.

11. The device according to claim 1, wherein the second conductive film and the fourth conductive film include a metal film and a conductive film including polysilicon.

12. The device according to claim 1, further comprising a peripheral transistor including a fifth insulating film, a fifth conductive film provided on the fifth insulating film, a sixth insulating film provided on the fifth conductive film, and the sixth conductive film provided on the sixth insulating film, the peripheral transistor having a through-portion in the sixth insulating film to electrically connect the fifth conductive film and the sixth conductive film, and an upper surface of the fifth conductive film being positioned higher than an upper surface of the first conductive film, wherein the semiconductor substrate has a cell region including the NAND string, and a peripheral region including the peripheral transistor.

13. The device according to claim 1, wherein the third insulating film is provided in the same plane as the first insulating film.

14. The device according to claim 1, wherein the second conductive film is a control gate of the memory cell transistor, and the fourth conductive film is a gate electrode of the select transistor.

15. The device according to claim 12, wherein the second conductive film is a control gate of the memory cell transistor;

the fourth conductive film is as a gate electrode of the select transistor; and the sixth conductive film is a gate electrode of the peripheral transistor.

* * * * *